US008933923B2

(12) United States Patent
Kato

(10) Patent No.: US 8,933,923 B2
(45) Date of Patent: Jan. 13, 2015

(54) DISPLAY DEVICE AND METHOD FOR DRIVING DISPLAY DEVICE

(75) Inventor: Toshiyuki Kato, Osaka (JP)

(73) Assignee: Panasonic Corporation, Osaka (JP)

( * ) Notice: Subject to any disclaimer, the term of this patent is extended or adjusted under 35 U.S.C. 154(b) by 272 days.

(21) Appl. No.: 13/601,839

(22) Filed: Aug. 31, 2012

(65) Prior Publication Data
US 2012/0327067 A1 Dec. 27, 2012

Related U.S. Application Data

(63) Continuation of application No. PCT/JP2011/003780, filed on Jul. 1, 2011.

(30) Foreign Application Priority Data

Jul. 2, 2010 (JP) .................................. 2010-151554

(51) Int. Cl.
G09G 5/00 (2006.01)
G09G 3/32 (2006.01)
(52) U.S. Cl.
CPC ............ G09G 3/3258 (2013.01); G09G 3/3291 (2013.01); G09G 2320/0626 (2013.01); G09G 2330/021 (2013.01); G09G 2330/12 (2013.01); G09G 2360/16 (2013.01); H01L 27/2344 (2013.01); G09G 2300/043 (2013.01); G09G 2320/041 (2013.01)
USPC .......................................... 345/212; 345/211
(58) Field of Classification Search
CPC ............................... G09G 5/00; G09G 3/3258
USPC ............ 345/76, 82, 204, 211, 212; 315/169.3
See application file for complete search history.

(56) References Cited

U.S. PATENT DOCUMENTS 7,071,635 B2 7/2006 Inoue et al.
7,872,619 B2 1/2011 Miller et al.
(Continued)

FOREIGN PATENT DOCUMENTS

JP 2003-280590 A 10/2003
JP 2006-065148 A 3/2006
(Continued)

OTHER PUBLICATIONS

International Search Report mailed Aug. 2, 2011 issued in corresponding International Application No. PCT/JP2011/003780.

Primary Examiner — Joe H Cheng
(74) Attorney, Agent, or Firm — McDermott Will & Emery LLP

(57) ABSTRACT

A display device according to the present disclosure includes: an organic EL display unit having pixels; a variable voltage source which supplies a voltage to the organic EL display unit; and a voltage drop amount calculating circuit which regulates the voltage output by the variable voltage source, according to video data, in which the organic EL display unit further includes an anode-side power source line network and a cathode-side power source line network connected to the pixels and the variable voltage source, for supplying the voltage from the variable voltage source, and the voltage drop amount calculating circuit estimates, from the video data, a distribution of voltage drop amount in the anode-side power source line network and the cathode-side power source line network for each of the pixels, and regulates the voltage based on the estimated distribution of voltage drop amount for each of the pixels.

13 Claims, 21 Drawing Sheets

(56) References Cited

U.S. PATENT DOCUMENTS

| | | |
|---|---|---|
| 7,973,745 B2 | 7/2011 | Mizukoshi et al. |
| 2003/0107542 A1* | 6/2003 | Abe et al. ............ 345/89 |
| 2004/0070579 A1 | 4/2004 | Kurihara |
| 2004/0150592 A1* | 8/2004 | Mizukoshi et al. ........ 345/76 |
| 2004/0183483 A1 | 9/2004 | Inoue et al. |
| 2004/0263444 A1* | 12/2004 | Kimura ............ 345/82 |
| 2007/0171155 A1* | 7/2007 | Pulvirenti et al. ........ 345/76 |
| 2007/0171163 A1 | 7/2007 | Miyata |
| 2008/0100542 A1 | 5/2008 | Miller et al. |
| 2008/0266216 A1* | 10/2008 | Choi ............ 345/77 |
| 2008/0284688 A1* | 11/2008 | Marx et al. ............ 345/76 |
| 2009/0207106 A1* | 8/2009 | Mizukoshi et al. ........ 345/76 |
| 2009/0225072 A1 | 9/2009 | Mizukoshi et al. |
| 2010/0020065 A1* | 1/2010 | Takasugi ............ 345/214 |
| 2010/0026732 A1* | 2/2010 | Otawara ............ 345/690 |
| 2010/0103203 A1* | 4/2010 | Choi ............ 345/690 |
| 2010/0109985 A1 | 5/2010 | Ono |
| 2010/0171774 A1 | 7/2010 | Mizukoshi et al. |
| 2010/0177024 A1* | 7/2010 | Choi ............ 345/76 |
| 2010/0201674 A1* | 8/2010 | Kim et al. ............ 345/211 |
| 2011/0242087 A1* | 10/2011 | Ebisuno et al. ........ 345/212 |
| 2012/0280970 A1* | 11/2012 | Kato et al. ............ 345/212 |
| 2012/0320024 A1* | 12/2012 | Ebisuno et al. ........ 345/212 |
| 2012/0327066 A1* | 12/2012 | Kato ............ 345/212 |
| 2013/0009939 A1* | 1/2013 | Ebisuno et al. ........ 345/212 |
| 2013/0162622 A1* | 6/2013 | Ebisuno et al. ........ 345/212 |
| 2014/0062989 A1* | 3/2014 | Ebisuno et al. ........ 345/212 |

FOREIGN PATENT DOCUMENTS

| | | |
|---|---|---|
| JP | 2008-502015 A | 1/2008 |
| JP | 2008-185809 A | 8/2008 |
| JP | 2009-031451 A | 2/2009 |
| JP | 2009-162980 A | 7/2009 |
| JP | 2009-198691 A | 9/2009 |
| JP | 2009-216801 A | 9/2009 |
| JP | 2010-039046 A | 2/2010 |
| JP | 2010-508559 A | 3/2010 |
| WO | WO-03/027999 A1 | 4/2003 |
| WO | WO-2005/122120 A2 | 12/2005 |
| WO | WO-2008/057187 A1 | 5/2008 |
| WO | WO-2009/011092 A1 | 1/2009 |
| WO | WO-2009/014634 A2 | 1/2009 |

* cited by examiner

Image A

Image B

Anode side

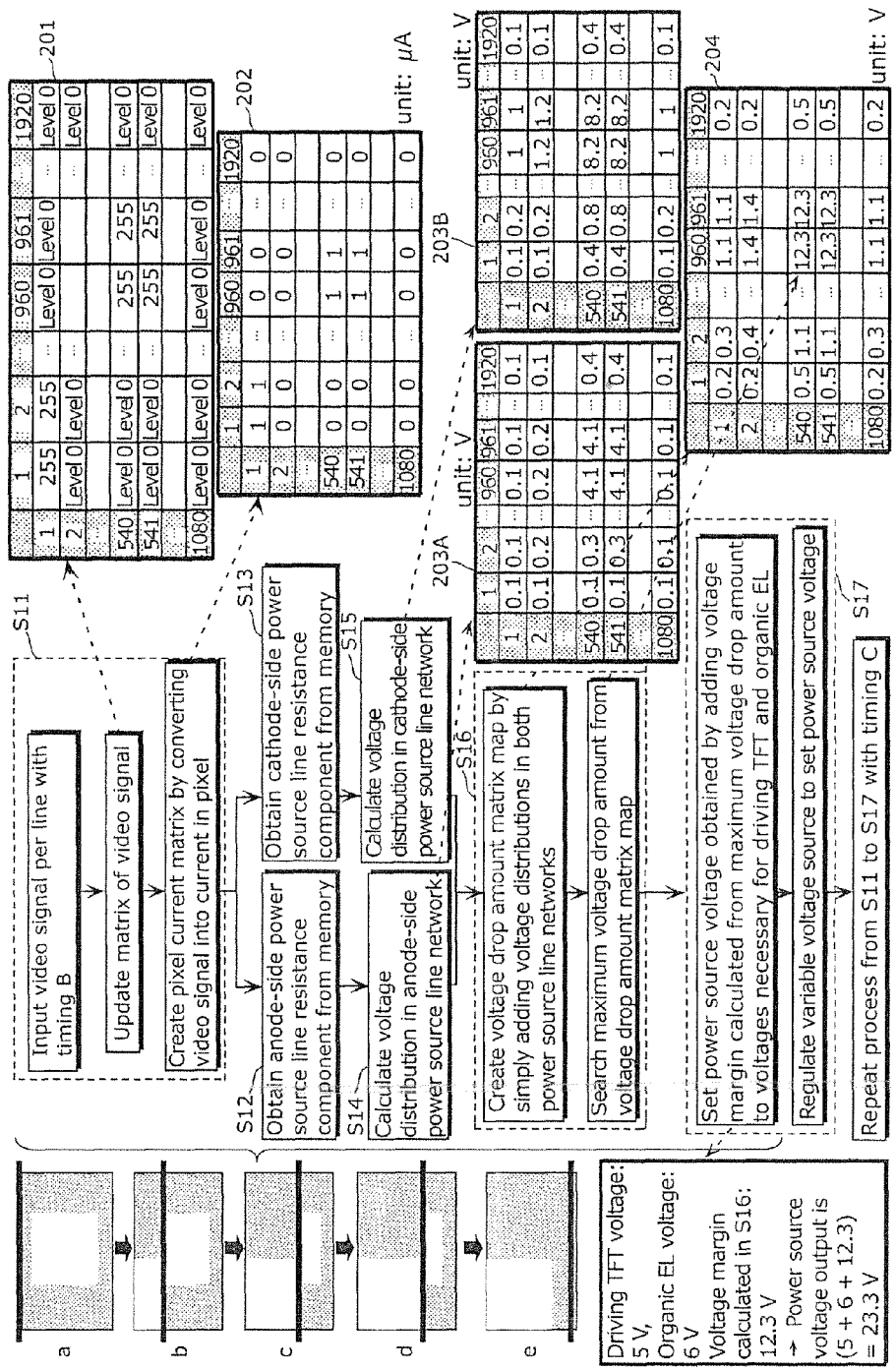

FIG. 11

Voltage drop amount [V]

| Block rows \ Block columns | 1 | 2 | --- | 8 | --- | 16 |
|---|---|---|---|---|---|---|
| 1 | 0.0 | 0.0 | --- | 0.0 | --- | 0.0 |
| 2 | 1.0 |  | --- | 9.0 | --- | 1.0 |
| ⋮ | ⋮ | ⋮ | --- | ⋮ | ⋱ | ⋮ |
| 5 | 1.0 |  | --- | 9.0 | --- | 1.0 |
| ⋮ | ⋮ | ⋮ | --- | ⋮ | ⋱ | ⋮ |
| 9 | 0.0 | 0.0 | --- | 0.0 | --- | 0.0 |

Voltage drop amount [V]

| Block rows \ Block columns | 1 | 2 | --- | 16 | --- | 32 |
|---|---|---|---|---|---|---|
| 1 | 0.0 | 0.0 | --- | 0.0 | --- | 0.0 |
| 2 | 0.5 | 1.0 | --- | 8.5 | --- | 0.5 |
| ⋮ | ⋮ | ⋮ | ⋱ | ⋮ | ⋱ | ⋮ |
| 9 | 0.5 | 1.0 | --- | 8.5 | --- | 0.5 |
| ⋮ | ⋮ | ⋮ | ⋱ | ⋮ | ⋱ | ⋮ |
| 18 | 0.0 | 0.0 | --- | 0.0 | --- | 0.0 |

Image A

Image B

DISPLAY DEVICE AND METHOD FOR DRIVING DISPLAY DEVICE

CROSS REFERENCE TO RELATED APPLICATIONS

This is a continuation application of PCT Patent Application No. PCT/JP2011/003780 filed on Jul. 1, 2011, designating the United States of America, which is based on and claims priority of Japanese Patent Application No. 2010-151554 filed on Jul. 2, 2010. The entire disclosures of the above-identified applications, including the specifications, drawings and claims are incorporated herein by reference in their entirety.

TECHNICAL FIELD

The present disclosure relates to an active-matrix display device which uses current-driven light-emitting elements represented by organic electroluminescence (EL) elements, and a method for driving the display device.

BACKGROUND ART

In general, the luminance of an organic electroluminescence (EL) element is dependent upon the drive current supplied to the element, and the luminance of the light emitted by the element increases in proportion to the drive current. Therefore, the power consumption of displays made up of organic EL elements is determined by the average of display luminance. Specifically, unlike liquid crystal displays, the power consumption of organic EL displays varies significantly depending on the displayed image. For example, in an organic EL display, the highest power consumption is required when displaying an all-white image, whereas, in the case of a typical natural image, power consumption which is approximately 20 to 40% that for all-white is considered to be sufficient.

However, because power source circuit design and battery capacity entail designing which assumes the case where the power consumption of a display becomes its highest, it is necessary to consider power consumption that is 3 to 4 times that for the typical natural image, and thus becoming a hindrance to the lowering of power consumption and the miniaturization of devices.

In response, there is conventionally proposed a technique which suppresses power consumption with practically no drop in display luminance, by detecting the peak value of video data and adjusting the cathode voltage of the organic EL elements based on such detected data so as to reduce power source voltage (for example, see Patent Literature 1).

CITATION LIST

Patent Literature

[Patent Literature 1] Japanese Unexamined Patent Application Publication No. 2006-65148
[Patent Literature 2] WO 2009/011092

SUMMARY OF INVENTION

Technical Problem

Now, since an organic EL element is a current-driven element, current flows through a power source line and a voltage drop which is proportionate to the line resistance occurs.

FIG. 18 is a circuit diagram illustrating a configuration of a circuit in a pixel for driving the organic EL element disclosed in the patent literature 2.

For example, in the configuration of the pixel circuit, even when the voltage drop occurs in the power source line, images can be appropriately displayed by the data line voltage which is set according to the video signal, if the source-drain voltage of the driver transistor Q1 for current-driving the organic EL element is high and the operating point is in the saturation region.

However, if the source-drain voltage of the driver transistor Q1 is low and the operating point is in the linear region, the image cannot be displayed appropriately due to significant influence of the resistance component in the organic EL element OLED and the switch transistor Q4 and the source-drain voltage of the driver transistor Q1.

Accordingly, the power source voltage to be supplied to the display is set with the voltage drop margin for compensating for the voltage drop such that the operating point of the driver transistor Q1 is in the saturation region.

In the same manner as the previously described power source circuit design and battery capacity, since the power drop margin for compensating for a voltage drop is set assuming the case where the power consumption of the display becomes highest, unnecessary power is consumed for typical natural images.

In a small-sized display intended for mobile device use, panel current is small and thus, compared to the voltage to be consumed by pixels, the voltage margin for compensating for a voltage drop is negligibly small.

However, when current increases with the enlargement of panels, the voltage drop occurring in the power source line no longer becomes negligible.

FIG. 19 illustrates an organic EL display in which pixels are arranged in a matrix. In FIG. 19, each pixel is modeled as a current source in which a driver transistor causes a flow of constant current according to the video signal.

Each pixel is connected to neighboring pixels mutually by the anode-side power source lines and the cathode-side power source lines.

FIGS. 20A and 20C are examples of display images. Although white windows of the same size are included in both images, the white windows are displayed in the different positions.

FIGS. 20B and 20D are graphs illustrating the distributions of the voltage drop values in the cathode-side power supply line when the display images are displayed on the organic EL display having configuration as illustrated in FIG. 19. More specifically, FIG. 20B is a graph illustrating the voltage drop values in the cathode-side power supply line when the image in FIG. 20A is displayed, and FIG. 20D is a graph illustrating the voltage drop values in the cathode-side power supply line when the image in FIG. 20C is displayed.

In the conventional technology disclosed in the patent literature 1, the peak values of the image A and the image B are identical. Accordingly, the same external application voltage is set for the image A and the image B.

However, as illustrated in FIGS. 20B and 20D, the voltage drop amount in the image B is approximately 2 V lower than that of the image A. Thus, when displaying the image B, it would probably be possible to set the external application voltage for the image A lower by 2 V than that of the image A so as to reduce the power consumption.

As described above, in the conventional technique in the patent literature 1, the voltage drop margin for compensating for the voltage drop cannot be reduced, and thus the power consumption reducing effect for household large-sized display devices of 30-inches and above is insufficient.

The present disclosure is conceived in view of the problems described above, and is to provide a display device having excellent power consumption reducing effect and the method of driving the display device.

Solution to Problem

In order to achieve the above, the display device according to the present disclosure is a display device including a display unit having a plurality of pixels that are arranged two-dimensionally, the display device including: a voltage source which supplies a voltage to the display unit; and a voltage regulating unit which regulates the voltage output by the voltage source, according to video data indicating luminance of each of the pixels, in which the display unit further includes at least one power source line connected to the pixels and the voltage source, for supplying the voltage from the voltage source, and the voltage regulating unit estimates, from the video data, a distribution of voltage drop amount in the at least one power source line for each of the pixels, and to regulate the voltage based on the estimated distribution of voltage drop amount for each of the pixels.

With this, the voltage supplied from the voltage source is regulated according to the video data. Thus, it is possible to achieve high power consumption reducing effect. For example, when comparing a case in which the video data representing the image illustrated in FIG. 20A is input and a case in which the video data representing the image illustrated in FIG. 20C is input, the voltage increase margin corresponding to the voltage drop amount can be set low, in the case of the image in FIG. 20C. More specifically, by regulating the voltage based on the distribution of the voltage drop amount in the organic EL display unit, it is possible to regulate voltage according to the video data even when the peak values are identical and two different image data items for different images are input. Therefore, the power consumption can be reduced.

The voltage regulating unit may calculate a distribution of the voltage drop amount for first blocks each including M pixels obtained by dividing the pixels equally in a column direction and a row direction, and estimate a distribution of the voltage drop amount for each of the pixels, based on the distribution of the voltage drop amount calculated for each of the first blocks, where M is an integer greater than or equal to 2.

With this, the operation amount can be significantly reduced, and thereby reducing the cost as well.

The voltage regulating unit may calculate a distribution of the voltage drop amount for second blocks each including N pixels obtained by dividing the pixels equally in a column direction and a row direction, and estimate the distribution of the voltage drop amount for each of the pixels, based on the distribution of the voltage drop amount calculated for each of the first blocks and the distribution of the voltage drop amount calculated for each of the second blocks, where N is an integer different from M and greater than or equal to 2.

With this, the voltage can be regulated with high precision with small operation amount. Therefore, the power consumption can be reduced further with low cost.

The voltage regulating unit may regulate the voltage, using a maximum value of the estimated distribution of the voltage drop amount for each of the pixels.

With this, it is possible to prevent the reduction in luminance of the pixel due to insufficient voltage.

The voltage source may supply, to the display unit, a first voltage and a second voltage different from the first voltage, the at least one power source line may include a first power source line for supplying the first voltage and a second power source line for supplying the second voltage, and the voltage regulating unit may estimate a first distribution and a second distribution for each of the pixels, the first distribution being a distribution of the voltage drop amount in the first power source line, the second distribution being a distribution of the voltage drop amount in the second power line, and to regulate the first voltage and the second voltage, based on a first distribution and a second distribution for each of the pixels estimated, respectively.

The voltage regulating unit may regulate the first voltage and the second voltage, using a sum of a maximum value of the first distribution and a maximum value of the second distribution.

With this, even when the display device includes two power source lines (the first power source line and the second power source line), it is possible to prevent the reduction in luminance of the pixel due to insufficient voltage.

The voltage regulating unit may calculate a total voltage drop amount which is a sum of the voltage drop amount in the first power source line and the voltage drop amount in the second power source line, by adding the first distribution and the second distribution for each of the pixels, and regulate the first voltage and the second voltage, based on the distribution of the total voltage drop amount calculated.

With this, when the position in the display unit at which the voltage drop amount in the first power source line is maximum and the position in the display unit at which the voltage drop amount in the second power source lines is maximum do not match, the power consumption can be reduced further.

The voltage regulating unit may regulate the first voltage and the second voltage, using a maximum value of the distribution of the total voltage drop amount calculated.

Each of the pixels may include a driver element and a light-emitting element, the driver element may include a source electrode and a drain electrode, the light-emitting element may include a first electrode and a second electrode, and the first electrode may be connected to one of the source electrode and the drain electrode of the driver element, and one of (i) the other of the source electrode and the drain electrode and (ii) the second electrode is connected to the first power source line, and the other of (i) the other of the source electrode and the drain electrode and (ii) the second electrode may be connected to the second power source line.

The second electrode may be a part of a common electrode provided in common to the pixels, and the common electrode may be electrically connected to the voltage source such that a potential is applied from a periphery of the common electrode.

The second electrode may be formed of a transparent conductive material made of a metal oxide.

The light-emitting element may be an organic electroluminescence (EL) element.

The present disclosure is not only implemented as the display device described above, but also as a method for driving the display device having the processing units composing the display device as steps.

The method of driving the display device according to the present disclosure is a method for driving a display device including a display unit having a plurality of pixels that are arranged two-dimensionally, and a voltage source which supplies a voltage to the display unit, the display unit further including at least one power source line connected to the pixels and the voltage source, for supplying the voltage from the voltage source, the method including: estimating, from video data which is data indicating luminance of each of the pixels, a distribution of voltage drop amount in the at least one power source line for each of the pixels; and regulating the voltage based on the distribution of voltage drop amount estimated for each of the pixels.

The estimating may include: calculating a distribution of the voltage drop amount for first blocks each including M pixels, obtained by dividing the pixels equally in a row direction and a column direction, where M is an integer greater than or equal to 2; calculating a distribution of the voltage drop amount for second blocks each including N pixels, obtained by dividing the pixels equally in a row direction and a column direction, where N is an integer different from M and greater than or equal to 2; and sub-estimating the distribution of the voltage drop amount for each of the pixels, based on the distribution of the voltage drop amount calculated for each of the first blocks and the distribution of the voltage drop amount calculated for each of the second blocks.

Advantageous Effects of Invention

According to the present disclosure, it is possible to implement the display device having high power consumption reduction effect and a method of driving the display device.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings:

FIG. 8 is a flowchart illustrating an example of the operation by the display device according to the embodiment in detail.

FIG. 11 is a chart illustrating voltage drop amount for each block calculated when the blocks are roughly divided.

DETAILED DESCRIPTION

The following shall describe embodiments for implementing the present disclosure with reference to the drawings.

Embodiment 1

The display device according to the embodiment 1 is a display device including a display unit having a plurality of pixels that are arranged two-dimensionally, the display device including: a voltage source which supplies a voltage to the display unit; and a voltage regulating unit which regulates the voltage output by the voltage source, according to video data indicating luminance of each of the pixels, wherein the display unit further includes at least one power source line connected to the pixels and the voltage source, for supplying the voltage from the voltage source, and the voltage regulating unit estimates, from the video data, a distribution of voltage drop amount in the at least one power source line for each of the pixels, and to regulate the voltage based on the estimated distribution of voltage drop amount for each of the pixels.

With this, the display device according to the embodiment regulates the voltage supplied from the voltage source, according to the video data. Thus, it is possible to achieve high power consumption reducing effect.

Figure 1:
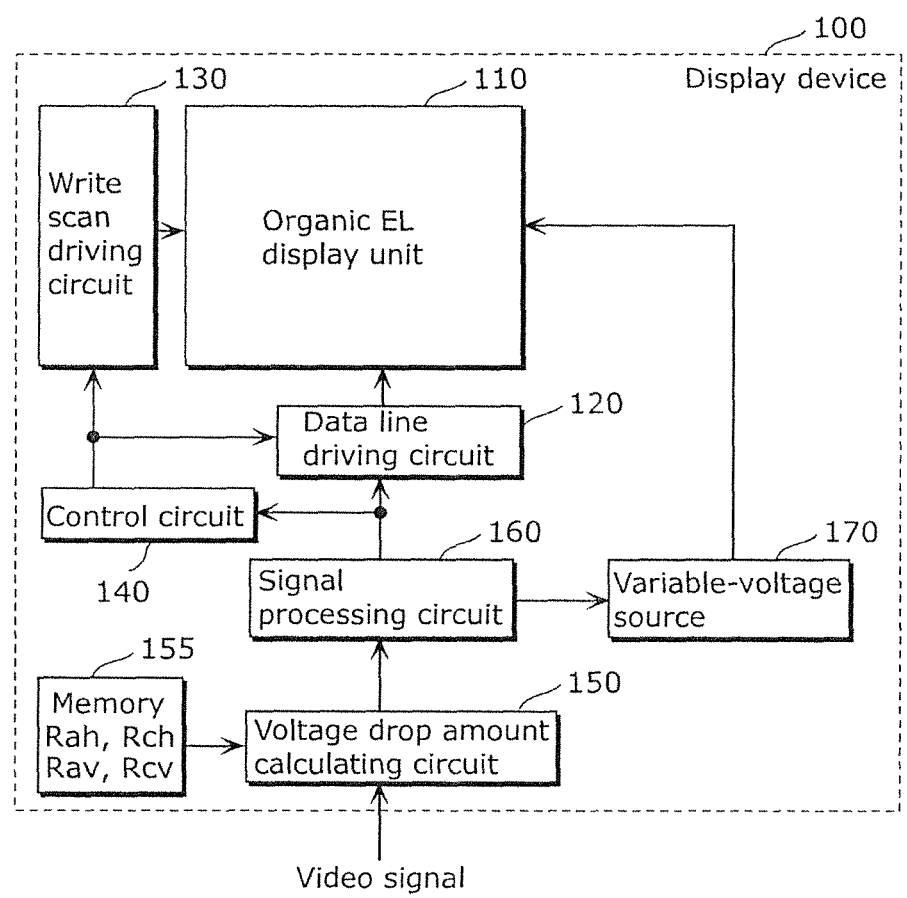
FIG. 1 is a block diagram showing an outline configuration of a display device according to the embodiment 1.

FIG. 1 is a block diagram showing an outline configuration of the display device according to the embodiment.

A display device 100 shown in the figure includes an organic EL display unit 110, a data line driving circuit 120, a write scan driving circuit 130, a control circuit 140, a voltage drop amount calculating circuit 150, a memory 155, a signal processing circuit 160, and a variable-voltage source 170.

Figure 2:
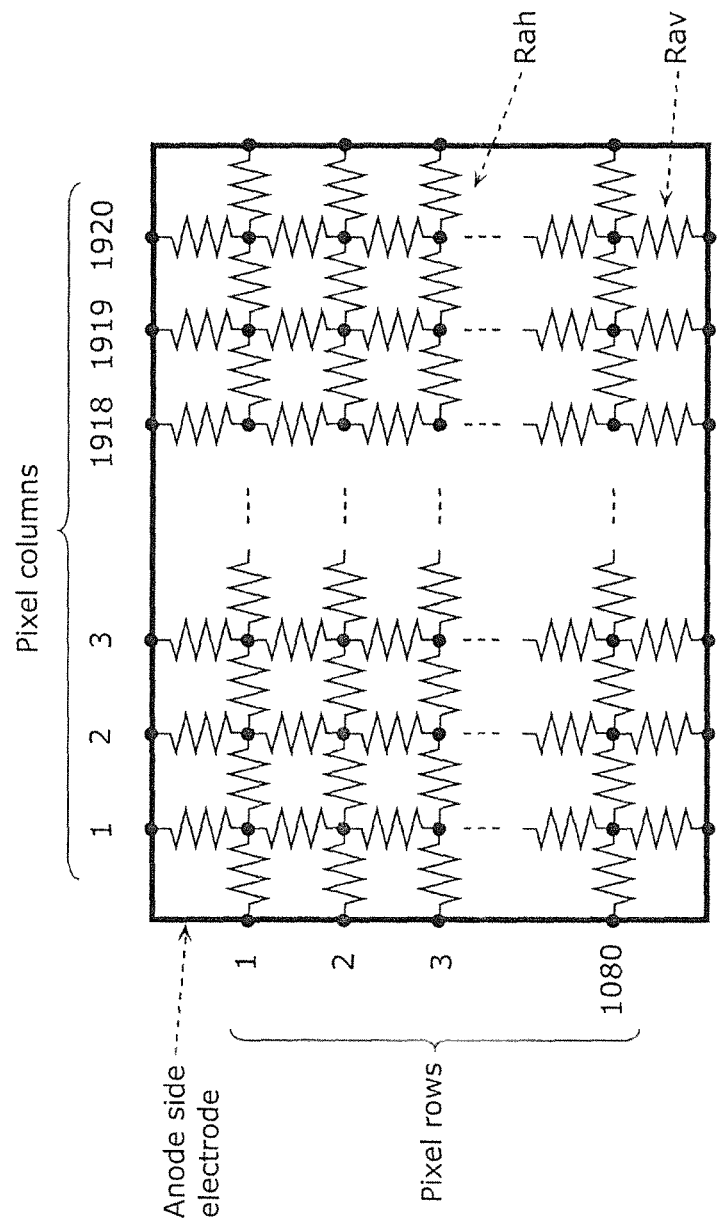
FIG. 2 is a diagram schematically illustrating a model of the anode-side power source line network in an organic EL display unit having 1920 pixels horizontally and 1080 pixels vertically.

FIG. 2 is a diagram schematically illustrating a model of the anode-side power source line network in the organic EL display unit 110 having 1920 pixels horizontally and 1080 pixels vertically.

Each pixel is connected to neighboring pixels above, below, on lateral sides by the horizontal resistance component Rah and the vertical resistance component Ray, and the peripheral part is connected to the anode side electrode to which external voltage is applied.

Figure 3:
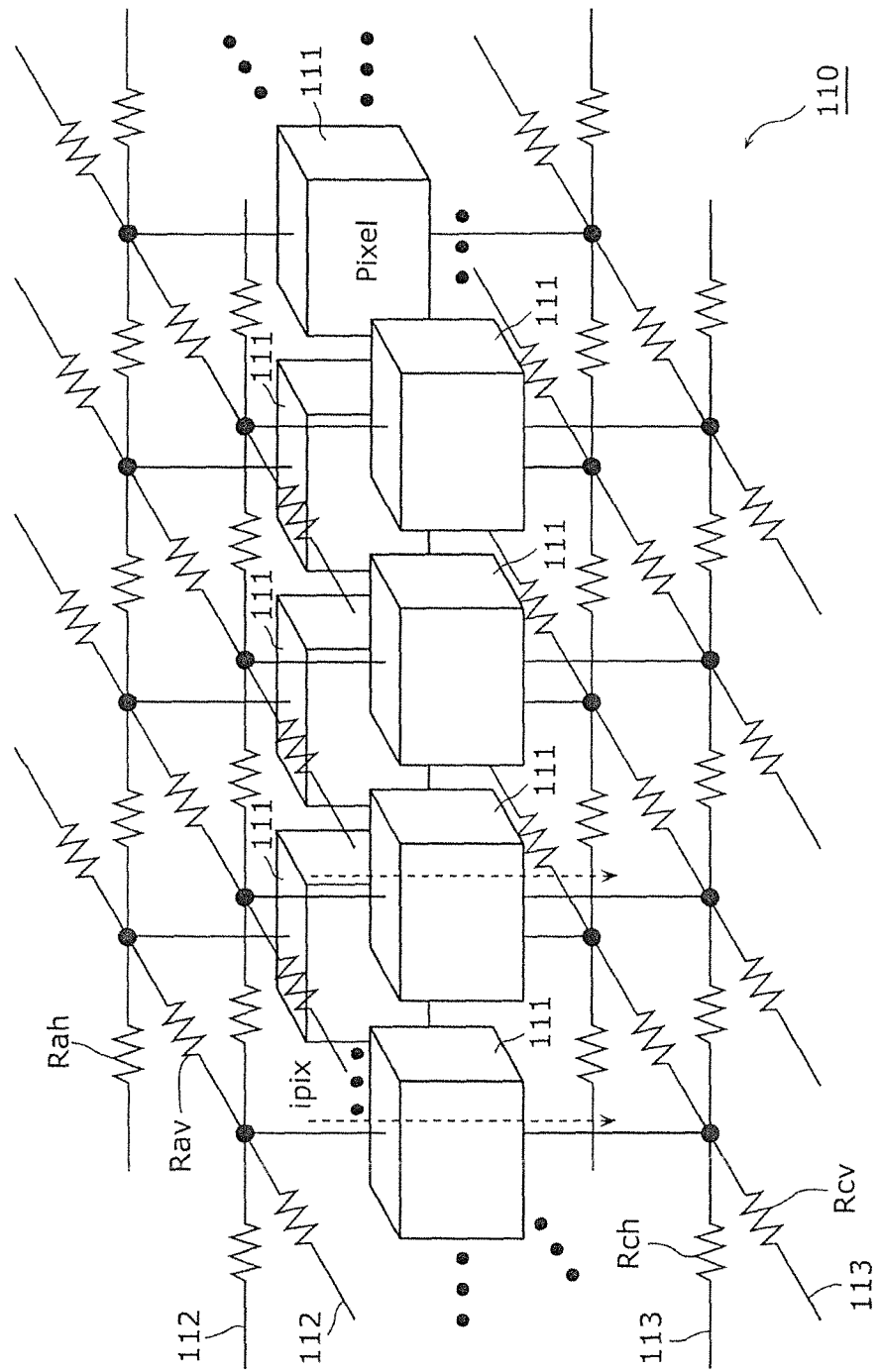
FIG. 3 is a perspective view schematically showing a configuration of an organic EL display unit.

FIG. 3 is a perspective view schematically illustrating the configuration of the organic EL display unit 110. Note that the lower part of the figure is the display screen side.

As shown in the figure, the organic EL display unit 110 includes pixels 111, an anode-side power source line network 112, and a cathode-side power source line network 113.

Each pixel 111 is connected to the anode-side power source line network 112 and the cathode-side power source line network 113, and emits light at luminance that is in accordance with a pixel current ipix that flows to the pixel 111.

The anode-side power source line network 112 is formed, for example, in a net shape. On the other hand, the cathode-side power source line network 113 is formed in the form of a continuous film on the organic EL display unit 110, and a voltage provided by the variable voltage source 170 is applied from the peripheral part of the organic EL display unit 110. In FIG. 3, the anode-side power source line network 112 and the cathode-side power source line network 113 are schematically illustrated in mesh-form in order to show the resistance components of the anode-side power source line network 112 and the cathode-side power source line network 113. Note that, the cathode-side power source line network 113 is a ground line, for example, and may be grounded on a common electric potential in the display device 100 at the peripheral portion of the organic EL display unit 110.

In the anode-side power source line network 112, horizontal resistance component Rah and vertical resistance component Ray exist. In the cathode-side power source line network 113, horizontal resistance component Rch and vertical resistance component Rcv exist. Note that, although not illustrated, each of the pixels 111 is connected to the write scan driving circuit 130 and the data line driving circuit 120, and is also connected to a scanning line for controlling the timing at which the pixel emits light and stops emitting light, and to a data line for supplying signal voltage corresponding to the luminance of light emitted from the pixel 111.

Figure 4:
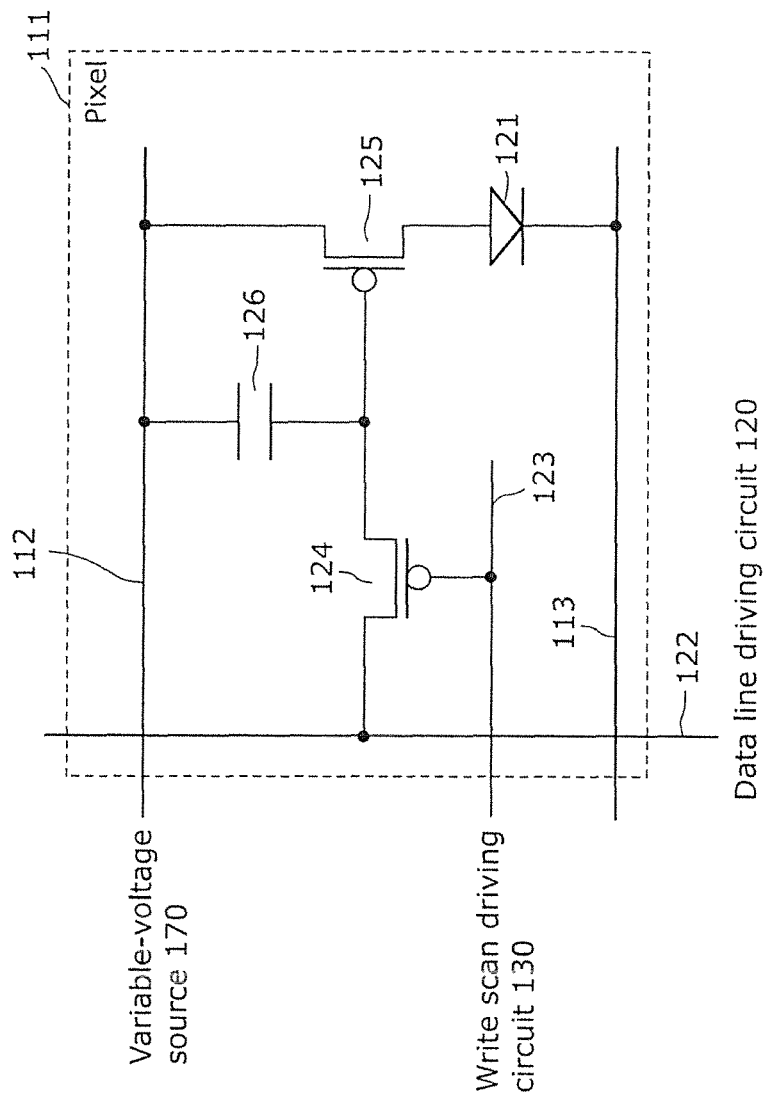
FIG. 4 is a circuit diagram illustrating an example of specific configuration of the pixel.

FIG. 4 is a circuit diagram illustrating an example of a specific configuration of the pixel 111.

The pixel 111 in FIG. 4 includes a driver element and a light-emitting element. The driver element includes a source electrode and a drain electrode. The light-emitting element includes a first electrode and a second electrode, and the first electrode is connected to one of the source electrode and the drain electrode of the driver element. The high-side voltage is applied to one of (i) the other of the source electrode and the drain electrode and (ii) the second electrode, and the low-side voltage is applied to the other of (i) the other of the source electrode and the drain electrode and (ii) the second electrode. Specifically, each of the pixels 111 includes an organic EL element 121, a data line 122, a scanning line 123, a switch transistor 124, a driving transistor 125, and a capacitor 126.

The pixels 111 are arranged two-dimensionally in the organic EL display unit 110, for example.

The organic EL element 121 is an example of a light-emitting element having an anode electrode connected to the drain electrode of the driving transistor 125 and a cathode electrode connected to the cathode-side power source line network 113, and emits light with luminance that is in accordance with the current value flowing between the anode and the cathode. The cathode-side electrode of the organic EL element 121 forms part of a common electrode provided in common to the pixels 111. The common electrode is electrically connected to the variable-voltage source 170 so that potential is applied to the common electrode from the peripheral part thereof. Specifically, the common electrode functions as the cathode-side power source line network 113 in the organic EL display unit 110. Furthermore, the cathode-side electrode is formed of a transparent conductive material made of a metallic oxide. Note that, the electrode on the anode side of the organic EL element 121 is an example of the first electrode, and the electrode on the cathode side of the organic EL element 121 is an example of the second electrode. The cathode-side power source line network 113 is an example of a second power source line network.

The data line 122 is connected to the data line driving circuit 120 and one of the source electrode and the drain electrode of the switch transistor 124, and signal voltage corresponding to video signal (video data) is applied to the data line 122 by the data line driving circuit 120.

The scanning line 123 is connected to the write scan driving circuit 130 and the gate electrode of the switch transistor 124, and switches between on and off of the switching transistor 124 according to the voltage applied by the write scan driving circuit 130.

The switching transistor 124 has one of a source electrode and a drain electrode connected to the data line 122, the other of the source electrode and the drain electrode connected to the gate electrode of the driving transistor 125 and one end of the capacitor 126, and is, for example, a p-type thin-film transistor (TFT).

The driving transistor 125 is an example of the driver element having a source electrode connected to anode-side power source line network 112, a drain electrode connected to the anode electrode of the organic EL element 121, and a gate electrode connected to the one end of the capacitor 126 and the other of the source electrode and the drain electrode of the switching transistor 124, and is, for example, a p-type TFT. With this, the driving transistor 125 supplies the organic EL element 121 with current that is in accordance with the voltage held in the capacitor 126. The anode-side power source line network 112 is an example of a first power source line.

The capacitor 126 has one end connected to the other of the source electrode and the drain electrode of the switch transistor 124, and the other end connected to the anode-side power source line network 112, and holds the potential difference between the potential of the anode-side power source line network 112 and the potential of the gate electrode of the driving transistor 125 when the switch transistor 124 is switched off. Specifically, the capacitor 126 holds a voltage corresponding to the signal voltage.

The data line driving circuit 120 outputs signal voltage corresponding to video signal, to the pixels 111 via the data lines 122.

The write scan driving circuit 130 sequentially scans the pixels 111 by outputting a scanning signal to scanning lines 123. Specifically, the switch transistors 124 are switched on and off per row. With this, the signal voltages outputted to the data lines 122 are applied to the pixels 111 in the row selected by the write scan driving circuit 130. Therefore, the pixels 111 emit light with luminance that is in accordance with the video signal.

The control circuit 140 instructs the drive timing to each of the data line driving circuit 120 and the write scan driving circuit 130.

The memory 155 is a storage unit in which numerical data of the horizontal resistance component Rah and the vertical component Rav in the anode-side power source line network 112 and the horizontal resistance component Rch and the vertical resistance component Rcv in the cathode-side power supply line network 113, which are illustrated in FIGS. 2 and 3 are stored in advance.

The voltage drop amount calculating circuit 150 is an example of the voltage regulating unit, and estimates, for each pixel 111, a distribution of voltage drop amount in the anode-side power source line network 112 and a distribution of voltage drop amount in the cathode-side power source line network 113 from the video signal input to the display device 100 and horizontal resistance component Rah, vertical resistance component Rav, horizontal resistance component Rch, and vertical resistance component Rcv read from the memory 155, and outputs, to the signal processing circuit 160, a signal indicating a voltage margin corresponding to the distribution of the voltage drop amount estimated.

The signal processing circuit 160 regulates the external application voltage which is an anode-side voltage and a cathode-side voltage output by the variable voltage source 170, according to a signal indicating a voltage margin output by the voltage drop amount calculating circuit 150. More specifically, the signal processing circuit 160 controls the variable voltage source 170 such that the external application voltage increases by the voltage margin.

The variable-voltage source 170 is an example of a voltage source, and supplies an anode-side voltage and a cathode-side voltage to the organic EL display unit 110. The variable voltage source 170 is a variable voltage power source which changes an external application voltage (anode-side voltage and cathode-side voltage), according to the voltage instructed by the signal processing circuit 160.

As described above, the display device 100 according to the embodiment estimates, for each pixel 111, the distribution of the voltage drop amount in the anode-side power source line network 112 and the distribution of the voltage drop amount in the cathode-side power source line network 113 from the input video signal, and regulates the external application voltage output from the variable voltage source 170, based on the distribution of the voltage drop amount in the anode-side power source line network 112 and the distribution of the voltage drop amount in the cathode-side power source line network 113 estimated for each pixel 111.

Next, the operation of the display device 100 according to the present disclosure shall be described with reference to FIG. 5, FIGS. 6A to 6C, and FIGS. 7A to 7C.

In the conventional display device, for example, a peak signal for each frame is extracted from the input video signal for each frame, and voltages necessary for driving the driving element and the organic EL element according to the peak signal are set so as to regulate the power source voltage. In contrast, in the display device according to the present disclosure, the voltage drop amount is estimated by a calculating using the horizontal resistance component (Rah, Rch) and the vertical resistance component (Rav, Rcv) stored in the memory 155 in advance, in addition to the video signal.

Figure 5:
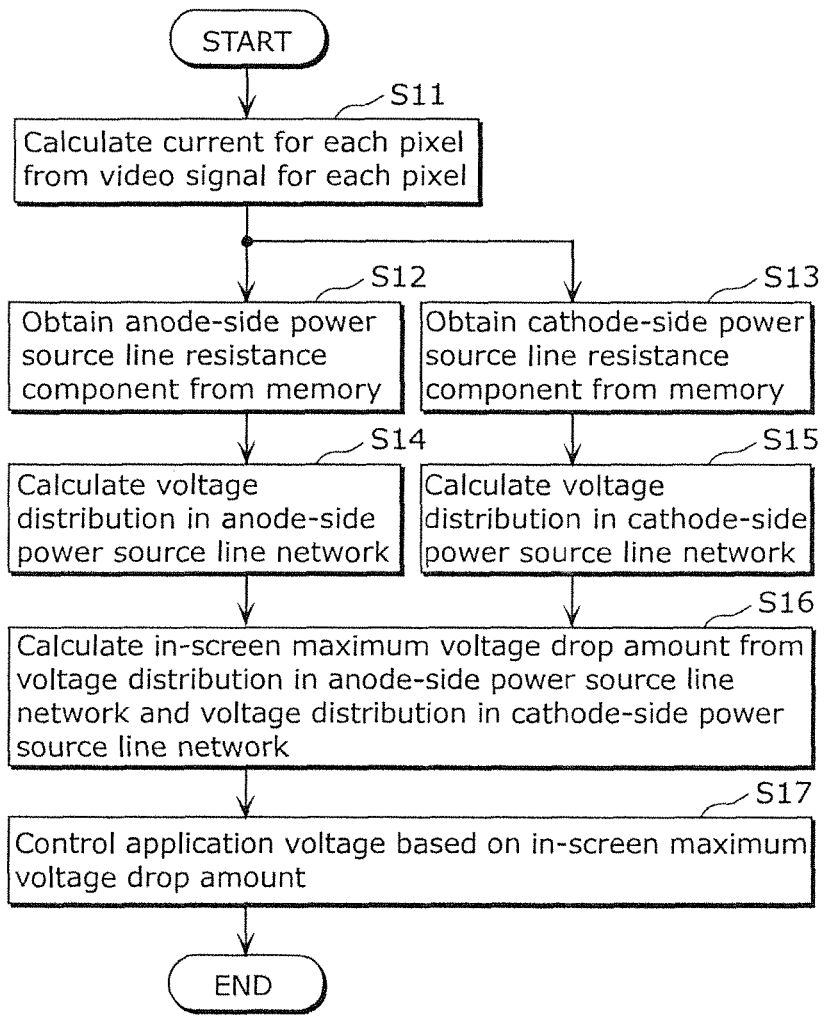
FIG. 5 is a flowchart showing an operation of a display device.

FIG. 5 is a flowchart showing an operation of the display device 100.

First, the voltage drop amount calculating circuit 150 calculates current flowing in each pixel from the video signal, using the conversion formula or the conversion table for the video signal and pixel current that are set in advance (step S11). More specifically, the voltage drop amount calculating circuit 150 obtains a video signal for one frame input to the display device 100, and calculates the pixel current flowing in each pixel 111 from the obtained video signal. Here, the voltage drop amount calculating circuit 150 has the conversion formula or the conversion table for associating the video signal and the pixel current when the pixel 111 emits light at the luminance corresponding to the video signal. Using the conversion formula or the conversion table, the voltage drop amount calculating circuit 150 calculates the pixel current flowing in the pixel 111, from the video signal for one frame input to the display device 100.

Next, the voltage drop amount calculating circuit 150 obtains the horizontal resistance component Rah and the vertical resistance component Rav in the anode-side power source line network 112, from the memory 155 (step S12).

Next, the voltage drop amount calculating circuit 150 calculates the voltage distribution of the anode-side power source line network 112 (step S14). More specifically, when the amount of voltage drop of the anode-side power source line network 112 is va(h, v), and the pixel current is i(h, v) in the pixel coordinates (h, v), the following equation 1 is derived with respect to the current i (h, v) in the pixel coordinates (h, v).

$$Rah \times \{va(h-1,v)-va(h,v)\}+Rah \times \{va(h+1,v)-va(h,v)\}+ \\ Rav \times \{va(h,v-1)-va(h,v)\}+Rav \times \{va(h,v+1)- \\ va(h,v)\}=i(h,v) \quad \text{(Equation 1)}$$

Note that, h is an integer from 1 to 1920, and v is an integer from 1 to 1080. In addition, since va (0, v) and va (1921, v), va (h, 0), va (h, 1081) are the amount of voltage drop generated in the line from the variable-voltage source 170 to the organic EL display unit 110 and are sufficiently small to be approximated by 0. Rah is the horizontal resistance component (admittance) of the anode-side power source wire 112 divided into blocks, and Rav is the vertical resistance component (admittance) of the second power source line 113 divided into blocks.

1920×1080 first-order simultaneous equations for 1920× 1080 unknown variables va (h, v) are obtained by deriving the equation 1 for each pixel 111. Therefore, the voltage drop amount va (h, v) in the voltage in the anode-side power source line network 112 can be obtained by solving the first-order simultaneous equations. In other words, the voltage distribution of the anode-side power source line 112 can be calculated for each pixel 111.

Figure 6A:
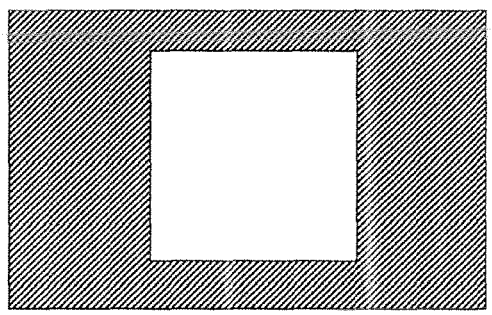
FIG. 6A is a diagram schematically illustrating an example of an image displayed on the organic EL display unit.

FIG. 6A is a diagram schematically illustrating an example of the image displayed on the organic EL display unit 110.

In the image A illustrated in FIG. 6A, the central part of the organic EL display unit 110 is white, and the rest of the organic EL display unit 110 is black.

Figure 6B:
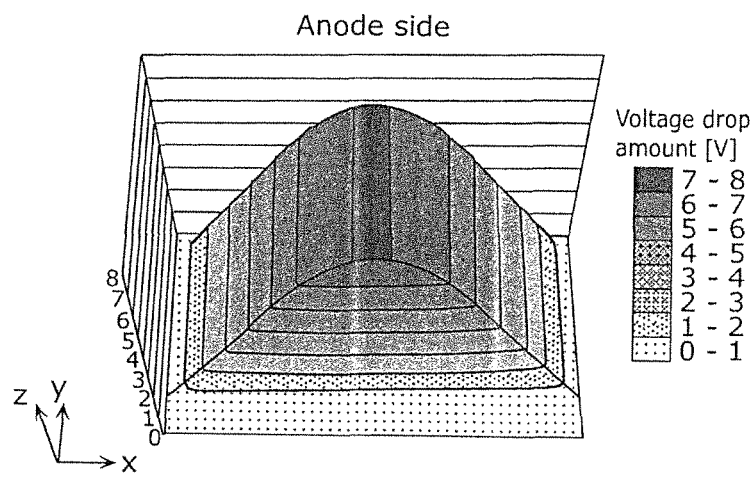
FIG. 6B is a graph illustrating a voltage distribution of the anode-side power source line network calculated from the video signals indicating the image in FIG. 6A.

FIG. 6B is a graph indicating voltage distribution of the anode-side power source line network 112 calculated from the video signal indicating the image A.

Figure 7A:
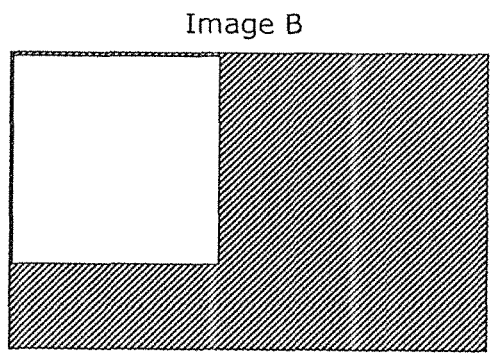
FIG. 7A is a diagram schematically illustrating another example of an image displayed on the organic EL display unit.
Figure 7B:
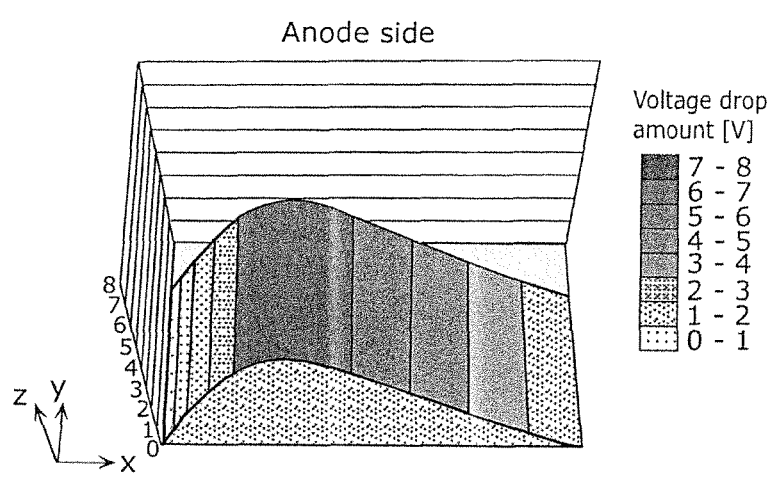
FIG. 7B is a graph illustrating a voltage distribution in the anode-side power source line network calculated from the video signals representing the image in FIG. 7A.
Figure 7C:
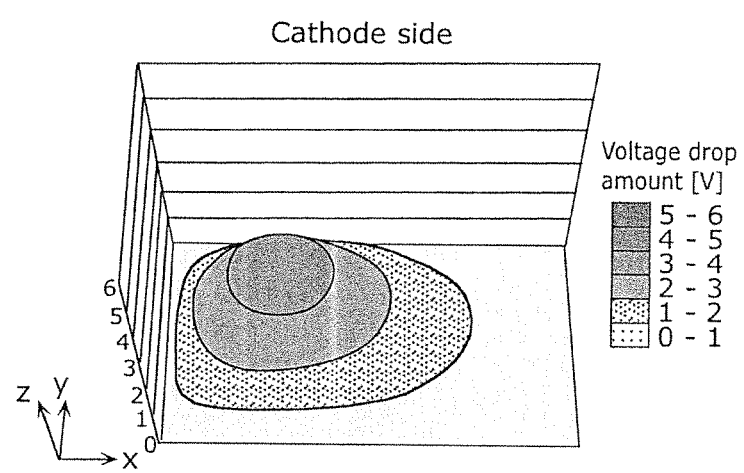
FIG. 7C is a graph illustrating a voltage distribution in the cathode-side power source line network calculated from the video signals representing the image in FIG. 7A.

X axis in FIG. 7C indicates the pixel coordinate in column direction, y axis indicates the pixel coordinate in row direction, and z axis indicates the amount of voltage drop. More specifically, the pixel coordinates (0, v) correspond to x axis, and the pixel coordinates (h, 0) correspond to y axis.

When the video signal representing the image A is input, the voltage drop amount calculating circuit 150 calculates the voltage drop amount va (h, v) for each pixel coordinates (h, v) from the equation 1, and calculates the voltage distribution of the anode-side power source line network 112 illustrated in FIG. 6B from the calculation result. Here, the anode-side power source line network 112 assumes a one-dimensional line having a substantially infinite vertical resistance component Rav illustrated in FIGS. 2 and 3. In other words, the anode-side power source line network 112 provided corresponding to the pixels 111 in different rows are arranged in parallel with each other in the horizontal direction (row direction). With this, the voltage drop amount in the anode-side power source line network 112 in the rows corresponding to the white region in the image A gradually increases toward the center of the image. In contrast, the voltage drop amount in the anode-side power source line network 112 in the rows other than the rows corresponding to the white region in the image A is substantially 0.

Similarly, the voltage drop amount calculating circuit 150 obtains the horizontal resistance component Rch and the vertical resistance component Rcv in the cathode-side power source line network 113 from the memory 155 after step S11 (step S13).

Next, the voltage drop amount calculating circuit 150 calculates the voltage distribution of the cathode-side power source line network 113 (step S15). More specifically, the voltage drop (increase) amount vc (h, v) in the cathode-side power source line network 113 can be obtained by writing a simultaneous equation for the cathode-side power source line network 113 in the pixel coordinates (h, v), in the same manner as the equation 1, and solving the simultaneous equation for the cathode-side power source line network 113. In other words, the voltage distribution of the anode-side power source line network 113 can be calculated for each pixel 111.

Figure 6C:
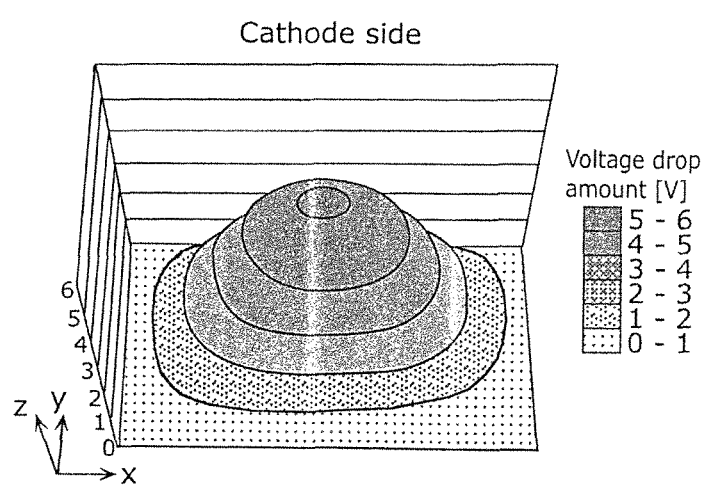
FIG. 6C is a graph illustrating a voltage distribution in a cathode-side power source line network calculated from video signals indicating the image in FIG. 6A.

FIG. 6C is a graph indicating voltage distribution of the cathode-side power source line network 113 calculated from the video signal indicating the image A.

X axis in FIG. 6C indicates the pixel coordinate in column direction, y axis indicates the pixel coordinate in row direction, and z axis indicates the amount of voltage drop.

The voltage drop amount calculating circuit 150 calculates the voltage drop (increase) amount in the cathode-side power source line network 113, in the same manner as the calculation of the voltage drop amount in the anode-side power source line network 112. Here, the cathode-side power source line network 113 is formed in the form of a continuous film. Accordingly, the voltage drop (increase) amount vc (h, v) in the cathode-side power source line network 113 is its largest at the center of the organic EL display unit 110, that is, at the pixel coordinates (960, 540). Note that, the process for calculating the voltage distribution in the anode-side power source line network 112 (step S14) and the process for calculating the voltage distribution in the cathode-side power source line network 113 (step S15) are examples of the estimating.

Next, the in-screen maximum voltage drop amount vmax, that is, a maximum value of va|(h, v)|+|vc (h, v)|, which is a sum of the voltage drop amount va (h, v) in the anode-side power source line network 112 and the voltage drop (increase) amount vc (h, v) in the cathode-side power source line network 113 (step S16). More specifically, the voltage drop amount calculating circuit 150 calculates a sum of the distribution of the voltage drop amount in the anode-side power source line network 112 and the distribution of the voltage drop (increase) amount in the cathode-side power source line network 113, corresponding to the pixel coordinates (h, v). With this, the voltage drop amount calculating circuit 150 calculates a distribution of total voltage drop amount which is a sum of the distribution of the voltage drop amount in the anode-side power source line network 112 and the distribution of the voltage drop (increase) amount in the cathode-side power source line network 113. Subsequently, the in-screen maximum voltage drop value vmax is calculated, from the distribution of the total voltage drop amount calculated.

Note that, the sum the maximum value vamax of the voltage drop amount va (h, v) and the maximum value vcmax of the voltage drop (increase) amount vc (h, v)|vamax|+|vcmax| satisfies the following relationship in comparison with the in-screen maximum voltage drop amount vmax calculated in step S16 vmax≤|vamax|+|vcmax|.

Accordingly, in order to reduce the calculation amount, |vamax|+|vcmax| may be used as the in-screen maximum voltage drop value.

With this, there is a possibility that the estimated voltage drop amount is excessive; the power reduction effect is lower than the method in step S16. However, since the estimated voltage drop amount is not too small, it does not cause any defect in the display image.

The voltage distribution in the anode-side power source line network 112 and the voltage distribution in the cathode-side power source line network 113 when the video signal different from the image signal representing the image A is input to the display device 100 shall be described.

FIG. 7A is a diagram schematically illustrating another example of an image displayed on the organic EL display unit.

The image B illustrated in FIG. 7A has a white region with the same size as the white region in the image A in FIG. 6A, which is displayed on a different position from the white region in the image A. More specifically, in the image B, the white region includes the pixel coordinates (1, 1).

FIG. 7B is a graph indicating voltage distribution of the anode-side power source line network 112 calculated from the video signal indicating the image B.

X axis in FIG. 7B indicates the pixel coordinate in column direction, y axis indicates the pixel coordinate in row direction, and z axis indicates the amount of voltage drop.

Compared to the voltage distribution of the anode-side power source line network 112 illustrated in FIG. 6B, the voltage distribution in the anode-side power source line network 112 illustrated in FIG. 7B has a distribution peak shifted to the left (toward the pixel coordinates (h, 0)), and a lower peak voltage. More specifically, while the maximum value of the voltage distribution in the anode-side power source line network 112 illustrated in FIG. 6B is 7 to 8 V, the maximum value of the voltage distribution in the anode-side power source line network 112 in FIG. 7B is 4 to 5 V, that is, a reduction by approximately 3 V.

FIG. 7C is a graph indicating voltage distribution of the cathode-side power source line network 113 calculated from the video signal indicating the image B.

X axis in FIG. 7C indicates the pixel coordinate in column direction, y axis indicates the pixel coordinate in row direction, and z axis indicates the amount of voltage drop.

Compared to the voltage distribution of the cathode-side power source line network 113 illustrated in FIG. 6C, the voltage distribution in the cathode-side power source line network 113 illustrated in FIG. 7C has a distribution peak shifted to the left, and a lower peak voltage, in the same manner as FIG. 7B. More specifically, while the maximum value of the voltage distribution in the cathode-side power source line network 113 illustrated in FIG. 6C is 5 to 6 V, the maximum value of the voltage distribution in the cathode-side power source line network 113 in FIG. 7C is 3 to 4 V, that is, a reduction by approximately 2 V.

When the image A illustrated in FIG. 6A and the image B illustrated in FIG. 7A are compared for the maximum values of the voltage drop vmax, vmax in the image A is 12 to 14 V, and vmax in the image B is 7 to 9 V. More specifically, the maximum voltage drop vmax calculated in the process for calculating the maximum voltage drop amount from the voltage distribution in the anode-side power source line network 112 and the voltage distribution in the cathode-side power source line network 113 (step S16) is different depending on the image. Particularly, although the image A and the image B have the same size of white region, the white region is displayed in different positions, resulting in different maximum values of the voltage drop amount vmax.

Next, the signal processing circuit 160 regulates the external application voltage output by the variable voltage source 170, according to the maximum voltage drop vmax calculated by the voltage drop amount calculating circuit 150 (step S17). More specifically, the voltage drop amount calculating circuit 150 outputs a signal representing the maximum voltage drop vmax calculated to the signal processing circuit 160. The signal processing circuit 160 calculates the voltage margin for the external application voltage output from the variable voltage source 170, from a signal representing the maximum voltage drop vmax inputted. The voltage margin is equivalent to the maximum voltage drop vmax calculated by the voltage drop amount calculating circuit 150, for example. With this, the variable voltage source 170 supplies a voltage with the voltage margin added to the organic EL display unit 110.

More specifically, the voltage to be supplied from the variable voltage source 170 to the organic EL display unit 110 is increased by the maximum voltage drop vmax as the voltage margin for compensating the amount of voltage drop. With this, it is possible to reduce the power consumption by setting the required external application voltage as low as possible, depending on video.

More specifically, when the video signal representing the image A is input, 12 to 14 V is set as the voltage margin, and when the video signal representing the image B is input, 7 to 9 V is set as the voltage margin. Stated differently, for the image A and the image B, even if the peak values of the video signals are identical, different external application voltages are supplied. In other words, when the image B is input, the voltage to be supplied to the anode-side power source line network 112 is to be lower than the case when the image A is input. Therefore, the power consumption can be reduced.

Note that, the process for calculating the in-screen maximum voltage drop amount (step S16) and the process for regulating the application voltage (step S17) are examples of the regulating.

In addition, in steps S14 and S15, the voltage drop amount calculating circuit 150 calculates the voltage drop amount for each pixel when the video signal input is provided, and the voltage distribution of the power source line network is calculated from the calculation result. However, the calculation is not limited to the process performed for one frame.

FIG. 8 is a flowchart showing an operation of the display device 100 in detail according to the embodiment. FIG. 8 describes an example of the operational flowchart in FIG. 5 in detail, and illustrates that the calculation of the voltage distribution in the power source line network in steps S14 and S15 is performed per pixel row, instead of per frame. On the left side of FIG. 8, a transition of the image from the state a showing the image A illustrated in FIG. 6A to the state e showing the image B illustrated in FIG. 7A. In other words, the period from the state a to the state e corresponds to one frame period. The following shall describe the operation using the voltage distribution calculation in the power source line network in the state b as an example.

First, the voltage drop amount calculating circuit 150 inputs the video signal for one pixel row updated between the state a and the state b.

Next, the voltage drop amount calculating circuit 150 updates the matrix of the video signal being held. More specifically, in the video signal matrix data 201 illustrated on the right side of FIG. 8, the tone data in the first pixel row is updated in a period between the state a to the state b.

Next, the voltage drop amount calculating circuit 150 creates the pixel current matrix using the updated matrix of the video signal and the conversion formula to the pixel current or the conversion table to the pixel current. More specifically, in the pixel current matrix data 202 illustrated on the right side of FIG. 8, the pixel current data for the first pixel row is updated in the period between the state a and the state b.

Next, the voltage drop amount calculating circuit 150 performs step S12 and step S13 illustrated in FIG. 5.

Next, the voltage drop amount calculating circuit 150 performs step S14 and step S15 illustrated in FIG. 5. More specifically, the voltage drop amount calculating circuit 150 creates the voltage distribution data 203A in the anode-side power source line network and the voltage distribution data 203B in the cathode-side power source line network illustrated on the right side of FIG. 8.

Next, the voltage drop amount calculating circuit 150 creates a voltage drop amount matrix data 2041 in which the voltage distribution data 203A in the anode-side power source line network and the voltage distribution data 203B in the cathode-side power source line network are simply added.

Subsequently, the voltage drop amount calculating circuit 150 determines the maximum voltage drop amount, based on the voltage drop amount matrix data 204. More specifically, in the voltage drop amount matrix data 204 illustrated on the right side of FIG. 8, the maximum voltage drop amount is determined to be 12.3 V (540th row, 960th column).

Next, the voltage drop amount calculating circuit 150 sets a voltage which is a sum of the voltage margin calculated from the maximum voltage drop amount to the voltage necessary for driving the driving transistor and the organic EL element as the power source voltage. More specifically, when the voltage necessary for the driving transistor is 5 V, and the voltage necessary for the organic EL element is 6 V, the maximum voltage drop amount 12.3 V is added to the voltages, and the power source voltage is determined to be 23.3 V.

Next, the signal processing circuit 160 regulates the variable voltage source 170 to set the power source voltage.

Using the process for controlling the power source voltage corresponding to the state b described above as one unit, the process is performed each time the video signal for one pixel row is updated.

Note that, in FIG. 8, when the process in the state e is performed after the process in the state a, instead of the process being performed for each pixel row, this corresponds to the process for each frame.

Furthermore, in FIG. 8, instead of the process being performed for each pixel row, the process may be performed using pixel rows as one unit.

An advantage of the embodiment in which the process is performed for one frame is that the processing time is secured. In contrast, the advantage of the embodiment in which the process is performed for each pixel row is that the accuracy of the setting of the power source voltage increases, although high-speed process is required.

As described above, the display device 100 according to the embodiment 1 is a display device including an organic EL display unit 110 having pixels arranged two-dimensionally, and the display device 100 further includes a variable voltage source 170 which supplies the anode-side voltage and the cathode-side voltage to the organic EL display unit 110, and a voltage drop amount calculating circuit 150 which regulates the anode-side voltage and the cathode-side voltage output by the variable voltage source 170, according to the video signal representing the luminance of each pixel 111. The organic EL display unit 110 further includes an anode-side power source line network 112 and the cathode-side power source line network 113 which are connected to the pixels 111 and the variable voltage source 170 and which receives the anode-side voltage and the cathode-side voltage supplied from the variable voltage source 170, respectively. The voltage drop amount calculating circuit 150 estimates the distribution of the voltage drop amount in the anode-side power source line network 112 and the cathode-side power source line network 113 from the video signal for each pixel 111, and regulates the anode-side voltage and the cathode-side voltage, based on the distribution of the voltage drop amount estimated for each pixel 111.

With this, high power consumption reducing effect can be achieved. More specifically, for the two video signals having the same peak value and the peaks at different positions in the organic EL display unit, voltages with different voltage margins added are supplied to the organic EL display unit 110. Accordingly, compared to the configuration in which the voltage margin is determined according to the peak of the video signal, the power consumption can be reduced further.

Furthermore, by reducing the power consumption, the heat generated by the display device 100 is suppressed, thereby preventing the degradation of the organic EL element 121.

Furthermore, the display device 100 according to the embodiment 1 calculates the maximum voltage drop vmax for each pixel 111 in the screen from the distribution of the total voltage drop amount calculated by the voltage drop amount calculating circuit 150, and regulates the external application voltage, using the maximum value vmax of the total voltage drop amount calculated for each pixel 111.

With this, it is possible to prevent the reduction in the luminance of the pixel 111 due to insufficient voltage.

Embodiment 2

In the embodiment 1, a technique that allows setting the external application voltage as small as possible so as to reduce the power consumption by calculating the voltage drop amount according to the video has been described. For example, in the case of an organic EL display having 1920 pixels horizontally and 1080 pixels vertically, it is necessary to solve 1920×1080 first-order simultaneous equations on the anode side or the cathode side. For this reason, an extremely large calculating circuit is necessary, and there is a problem of increased cost.

In the embodiment 2, in order to address this problem, a method for dividing the pixels into blocks so as to significantly reduce the operation amount shall be described. More specifically, in this embodiment, the voltage regulating unit calculates a distribution of the voltage drop amount for first blocks each including M pixels obtained by dividing the pixels equally in a column direction and a row direction, and to estimate a distribution of the voltage drop amount for each of the pixels, based on the distribution of the voltage drop amount calculated for each of the first blocks, where M is an integer greater than or equal to 2. More specifically, the voltage regulating unit calculates a distribution of the voltage drop amount for second blocks each including N pixels obtained by dividing the pixels equally in a column direction and a row direction, and to estimate the distribution of the voltage drop amount for each of the pixels, based on the distribution of the voltage drop amount calculated for each of the first blocks and the distribution of the voltage drop amount calculated for each of the second blocks, where N is an integer different from M and greater than or equal to 2.

Note that, the configuration of the display device according to the embodiment 2 is nearly identical to the configuration of the display device 100 according to the embodiment 1, and differs in the function of the voltage drop amount calculating circuit 150 which is an example of the voltage regulating unit.

Figure 9:
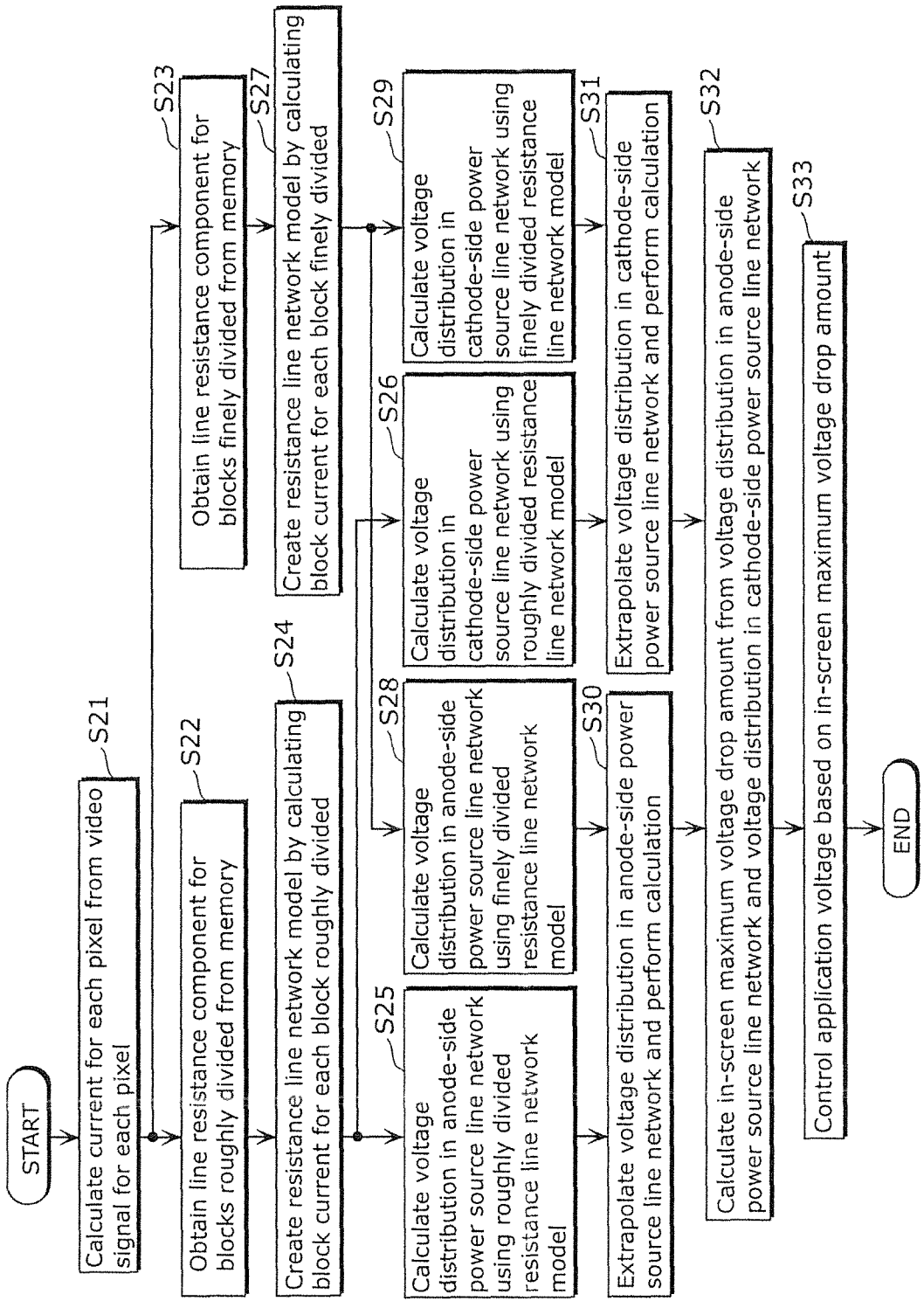
FIG. 9 is a flowchart showing an operation of a display device according to the embodiment 2.

FIG. 9 is a flowchart showing an operation of the display device.

First, the voltage drop amount calculating circuit 150 calculates the current flowing in each pixel from the video signal, using the conversion formula or the conversion table for the predetermined pixel current of the video signal (step S21). Note that, the process for calculating the current flowing in each pixel (step S21) is identical to the process for calculating the current flowing in the pixel illustrated in the embodiment 1 (step S11). Accordingly, detailed description of the process is omitted.

Next, the voltage drop amount calculating circuit 150 obtains the horizontal resistance component Rah1 and the vertical resistance component Rav1 in the anode-side power source line network 112 roughly divided into blocks and the horizontal resistance component Rch1 and the vertical resistance component Rcv1 of the cathode-side power source line network 113 roughly divided into blocks from the memory 155 (step S22).

Next, the voltage drop amount calculating circuit 150 calculates block current for each block roughly divided, and creates a resistance line network model (step S24). Here, a model of the resistance line network when the blocks are roughly divided shall be described.

Figure 10:
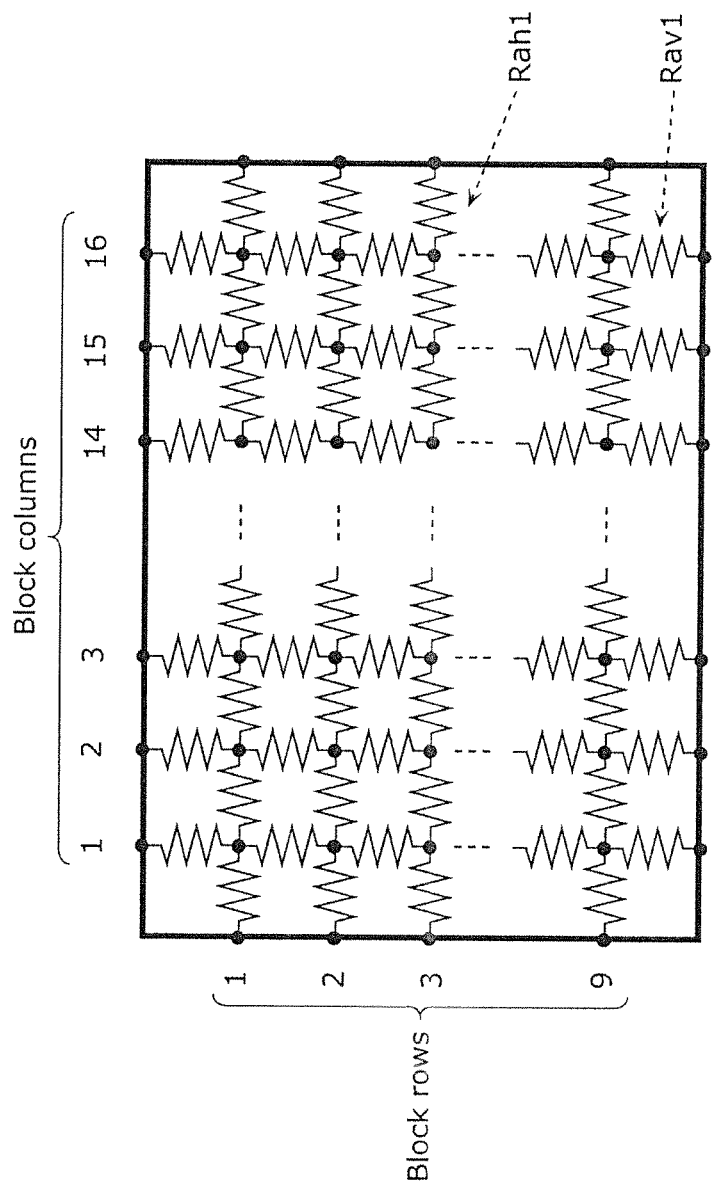
FIG. 10 is a diagram schematically illustrating a model of the anode-side power source line in which one block includes 120 pixels horizontally and 120 pixels vertically.

FIG. 10 is a diagram schematically illustrating a model of the anode-side power source wire 112 in the organic EL display unit 110 having 1920 pixels horizontally and 1080 pixels vertically in which one block includes 120 pixels horizontally and 120 pixels vertically.

Each block is connected to neighboring blocks above, below, and laterally by the horizontal resistance component Rah1 and the vertical resistance component Rav1, and a peripheral part is connected to the anode side electrode at which the external application voltage is applied. In other words, it is considered that one block (120×120 pixels) is provided at an intersection of the horizontal resistance component Rah1 and the vertical resistance component Rav1.

Next, the voltage drop amount calculating circuit 150 calculates the voltage distribution in the anode-side power source line network 112 roughly divided into blocks as illustrated in FIG. 10 (step S25).

Here, the calculation order for the voltage distribution in the anode-side power source line network 112 roughly divided into blocks shall be described.

First, the voltage drop amount calculating circuit 150 calculates block current by calculating a sum of pixel current for each block.

Next, if the voltage drop amount in the second power source line in a block coordinates (h, v) is val (h, v), and a block current is i1 (h, v), the following equation 2 with respect to the current in the block coordinates (h, v) is derived.

$$Rah1\times\{va1(h-1,v)-va1(h,v)\}+Rah1\times\{va1(h+1,v)-va1(h,v)\}+Rav1\times\{va1(h,v-1)-va1(h,v)\}+Rav1\times\{va1(h,v+1)-va1(h,v)\}=i1(h,v) \quad \text{(Equation 2)}$$

Note that h is an integer from 1 to 16, and v is an integer from 1 to 9. Furthermore, va1 (0, v) and va1 (17, v), va1 (h, 0), va1 (h, 10) are voltage drop amount in the line from the variable-voltage source 170 to the organic EL display unit 110, and can be approximated to 0 since the voltage drop amount are sufficiently small. Rah1 is the horizontal resistance component (admittance) of the anode-side power source line network 112 roughly divided into blocks, and Rav1 is the vertical resistance component (admittance) of the anode-side power source line network 112 roughly divided into blocks.

By deriving the equation 2 for each block, 16×9 first-order simultaneous equations for 16×9 unknown variables va1 (h, v) are obtained. By solving the first-order simultaneous equations, the voltage drop amounts va1 (h, v) of the anode-side power source wire 112 in each block when one block is modeled by the 120 pixels horizontally and 120 pixels vertically can be obtained. To put it differently, the voltage distribution of the anode-side power source line 112 can be calculated for each block roughly divided (120 pixels horizontally, 120 pixels vertically).

FIG. 11 is a chart illustrating voltage drop amount for each block calculated when the blocks are roughly divided.

As illustrated in FIG. 11, the amount of voltage drop is calculated corresponding to the block row and the block column. For example, the voltage drop amount in a block at the center of the organic EL display unit 110, that is, in the block coordinates (8, 5) is calculated as 9.0 V.

Furthermore, the maximum value va1max of the in-screen voltage drop in which the voltage drop amount va1 (h, v) in the anode-side power source line network 112 when the blocks are roughly divided.

In the same manner, by obtaining simultaneous equations for the cathode-side power source line network 113 and solving the simultaneous equations, the voltage drop amount vc1 (h, v) of the cathode-side power source line network 113 when the pixels are modeled such that one block includes 120 pixels horizontally and 120 pixels vertically can be obtained. More specifically, the voltage distribution in the cathode-side power source line network 113 is calculated for each block (120 pixels horizontally and 120 pixels vertically) roughly divided (step S26).

Similarly, the voltage drop amount calculating circuit 150 obtains the horizontal resistance component Rah2 and the vertical resistance component Rav2 in the anode-side power source line network 112 and the horizontal resistance component Rch2 and the vertical resistance component Rcv2 in the cathode-side power source line network 113 finely divided into blocks from the memory 155 after step S21 (step S23).

Next, the voltage drop amount calculating circuit 150 calculates the block current for each block finely divided, and creates a resistance line network model (step S27). Here, a resistance line network model when the blocks are finely divided shall be described.

Figure 12:
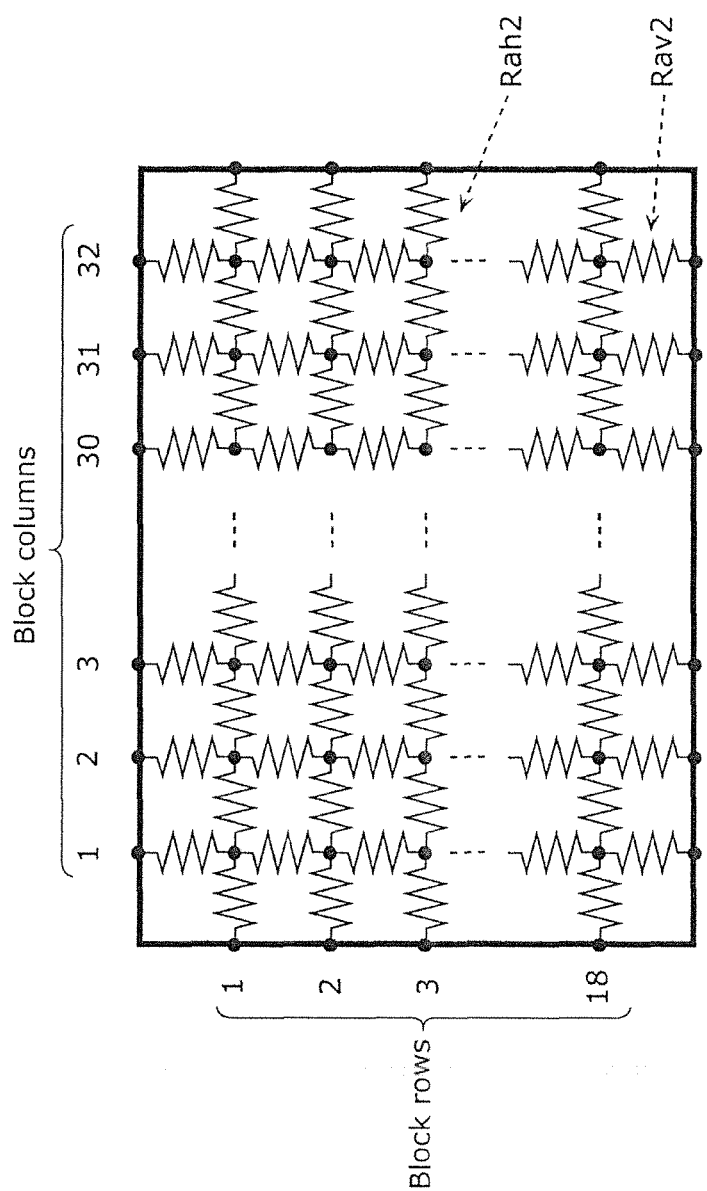
FIG. 12 is a diagram schematically illustrating a model of the anode-side power source line in which one block includes 60 pixels horizontally and 60 pixels vertically.

FIG. 12 is a diagram schematically illustrating a model of the anode-side power source wire 112 in the organic EL display unit 110 having 1920 pixels horizontally and 1080 pixels vertically in which one block includes 60 pixels horizontally and 60 pixels vertically.

Each block is connected to neighboring blocks above, below, and laterally by the horizontal resistance component Rah2 and the vertical resistance component Rav2, and a peripheral part is connected to the anode side electrode at which the external application voltage is applied. In other words, it is considered that one block (60×60 pixels) is provided at an intersection of the horizontal resistance component Rah2 and the vertical resistance component Rav2.

Next, the voltage drop amount calculating circuit 150 calculates the voltage distribution in the anode-side power source line network 112 finely divided into blocks as illustrated in FIG. 12 (step S28).

Here, the calculation order for the voltage distribution in the cathode-side power source line network 113 finely divided into blocks shall be described.

First, the voltage drop amount calculating circuit 150 calculates block current by calculating a sum of pixel current for each block.

Next, if the voltage drop amount in the anode side power source line in block coordinates (h, v) is va2 (h, v), and a block current is i2 (h, v), the following equation 3 with respect to the current in the block coordinates (h, v) is derived.

$$Rah2 \times \{va2(h-1,v) - va2(h,v)\} + Rah2 \times \{va2(h+1,v) - va2(h,v)\} + Rav2 \times \{va2(h,v-1) - va2(h,v)\} + Rav2 \times \{va2(h,v+1) - va2(h,v)\} = i2(h,v) \quad \text{(Equation 3)}$$

Note that h is an integer from 1 to 32, and v is an integer from 1 to 18. Furthermore, va2 (0, v) and va2 (33, v), va2 (h, 0), va2 (h, 19) are voltage drop amount in the line from the variable-voltage source 170 to the organic EL display unit 110, and can be approximated to 0 since the voltage drop amount is sufficiently small. In addition, Rah2 is the horizontal resistance component (admittance) of the anode-side power source wire 112 finely divided into blocks, and Rav2 is the vertical resistance component (admittance) of the anode-side power source line 112 finely divided into blocks.

By deriving the equation 3 for each block, 32×18 first-order simultaneous equations for 32×18 unknown variables va2 (h, v) are obtained. By solving the first-order simultaneous equations, the voltage drop amounts va2 (h, v) of the anode-side power source wire 112 in each block when one block is modeled by the 60 pixels horizontally and 60 pixels vertically can be obtained. To put it differently, the voltage distribution of the anode-side power source line 112 can be calculated for each block finely divided (60 pixels horizontally, 60 pixels vertically).

Figures 13, 14:
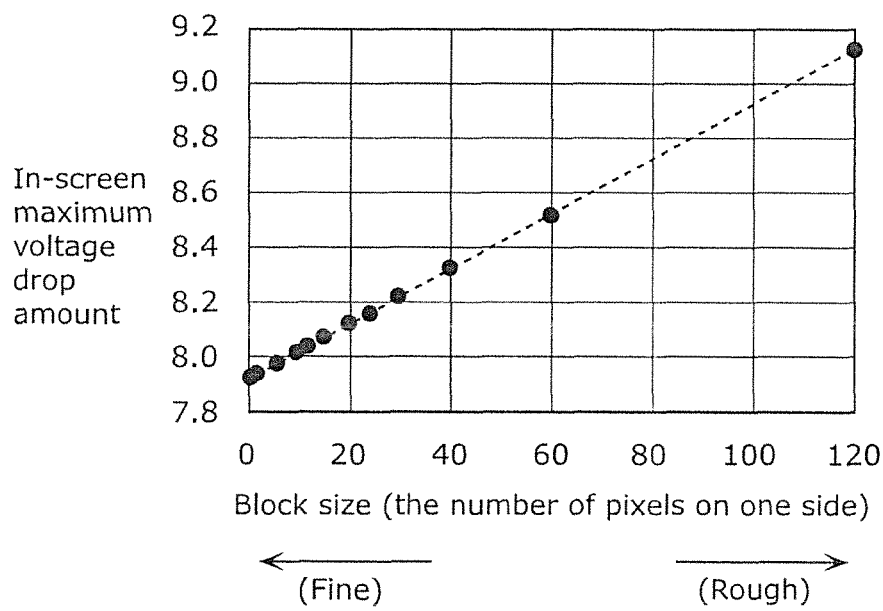
FIG. 13 is a chart illustrating voltage drop amount for each block calculated when the blocks are finely divided.
FIG. 14 is a graph illustrating a relationship between the number of horizontal and vertical pixels when blocks are divided, and a maximum value of the voltage drop calculated based on the block model.

FIG. 13 is a chart illustrating voltage drop amount for each block calculated when the blocks are finely divided.

As illustrated in FIG. 13, the amount of voltage drop is calculated corresponding to the block row and the block column. For example, the voltage drop amount in a block at the center of the organic EL display unit 110, that is, in the block coordinates (16, 9) is calculated as 8.5 V.

Furthermore, the maximum in-screen voltage drop value va2max of the voltage drop amount va2 (h, v) in the anode-side power source line network 112 when the blocks are finely divided. Stated differently, the in-screen maximum voltage drop v2max, which is the maximum value of the sum of the voltage drop amount on the anode side and the voltage drop amount on the cathode side for each pixel |va2 (h, v)|+|vc2 (h, v)| can be obtained.

By obtaining the simultaneous equations for the cathode-side power source line network 113 and solving the simultaneous equations, the voltage drop amounts vc2 (h, v) of the cathode-side power source wire 113 in each block when one block is modeled by the 60 pixels horizontally and 60 pixels vertically can be obtained. More specifically, the voltage distribution in the cathode-side power source line network 113 is calculated for each block finely divided (120 pixels horizontally and 120 pixels vertically) (step S29).

Next, the voltage drop amount calculating circuit 150 calculates the voltage drop amount in the anode-side power source line network 112 for each pixel 111, from the voltage drop amount va1 (h, v) calculated in the process for calculating the voltage distribution in the anode-side power source line network 112 using the resistance line network model roughly divided into blocks (step S25), and the voltage drop amount va2 (h, v) calculated in the process for calculating the voltage distribution in the anode-side power source line network 112 using the resistance line network model finely divided into blocks (step S28). More specifically, the voltage drop amount in the anode-side power source line network 112 for each pixel 111 is calculated by extrapolation using the voltage drop amount va1 (h, v) when the blocks are roughly divided, and the voltage drop amount va2 (h, v) when the blocks are finely divided (step S30).

Here, the calculation order of the voltage drop amount for each pixel 111 by extrapolation shall be described.

So far, the maximum values of the two voltage drop amount, namely, va1max and va2max are obtained from the calculation results using blocks divided into two different sizes. Each of the maximum values has an error from the actual maximum value of the voltage drop amount due to blocking. Stated differently, the maximum value va1max of the voltage drop in the anode-side power source line network 112 when the blocks are roughly divided, and the maximum value va2max of the voltage drop in the anode-side power source line network 112 when the blocks are finely divided have errors with respect to the maximum value of the voltage drop amount in the anode-side power source line network 112 for each pixel 111.

FIG. 14 is a graph illustrating a relationship between the number of horizontal and vertical pixels included in each block, and the maximum value of the voltage drop calculated from the model divided into blocks, for a video signal.

In FIG. 14, the larger the block size used in modeling for voltage drop amount calculation, the larger the error becomes with respect to the voltage drop amount calculated when the block size is 1, which is the actual voltage drop amount.

Furthermore, since the relationship between the block size and the error is approximately proportional, it is possible to calculate the extrapolation voltage drop amount with a significantly small error with respect to the voltage drop amount calculated for the block size 1 (one pixel 111 is included in one block) by extrapolating the voltage drop amount calculated by two different block models.

Therefore, using the maximum value va1max of the voltage drop obtained by the model having a block size of 120× 120 pixels and the maximum value va2max of the voltage drop obtained by the model having a block size of 60×60 pixels, the extrapolation voltage drop amount vamax calculated when the block size is 1×1 pixel is calculated using the following equation 4.

$$vamax = va2max - (va1max - va2max) \times (60-1)/(120-60) \quad \text{(Equation 4)}$$

More specifically, in the embodiment 2, the voltage drop amount calculating circuit 150 calculates the distribution of the voltage drop amount in the anode-side power source line network 112 for each block roughly divided and having 120× 120 pixels obtained by dividing the pixels 111 equally in the row direction and the column direction, calculates the distribution of the voltage drop amount in the anode-side power source line network 112 for each block finely divided and having 60×60 pixels obtained by dividing the pixels 111 equally in the row direction and the column direction, and estimates the distribution of the voltage drop amount in the anode-side power source line network 112 from the distribution of the voltage drop amount calculated for each block roughly divided, and the distribution of the voltage drop amount for each block finely divided.

In the same manner, for the cathode-side power source line network 113, the voltage drop amount calculating circuit 150 calculates the voltage drop amount in the cathode-side power source line network 113 for each pixel 111, from the voltage drop amount vc1 (h, v) calculated in the process for calculating the voltage distribution in the cathode-side power source line network 113 using the resistance line network model roughly divided into blocks and the voltage drop amount vc2 (h, v) calculated in the process for calculating the voltage distribution in the cathode-side power source line network 113 using the resistance line network model finely divided into blocks. More specifically, the voltage drop amount in the cathode-side power source line network 113 is calculated for each pixel 111 by extrapolation, using the voltage drop amount vc1 (h, v) when the blocks are roughly divided, and the voltage drop amount vc2 (h, v) when the blocks are finely divided (step S31).

Next, the in-screen maximum voltage drop, that is, a maximum value of a sum of the voltage drop amount in the anode-side power source line network 113 and the voltage drop amount in the cathode-side power source line network 113 in each pixel 111 is calculated, from the voltage drop amount in the anode-side power source line network 112 for each pixel 111 estimated in the process for calculating the voltage drop amount in the anode-side power source line network 112 (step S30) and the voltage drop amount in the cathode-side power source line network 113 for each pixel 111 estimated in the process for calculating the voltage drop amount in the cathode-side power source line network 113 by extrapolation (step S31) (step S32). Note that, the process for calculating the in-screen maximum voltage drop (step S32) is identical to the process for calculating the in-screen maximum voltage drop vmax (step S16) described in the embodiment 1. Accordingly, the detailed description for the process shall be omitted.

Finally, the signal processing circuit 160 regulates the external application voltage output by the variable voltage source 170, according to the maximum voltage drop calculated by the voltage drop amount calculating circuit 150 (step S33). Note that, the process for controlling the external application voltage output by the variable voltage source 170 (step S33) is identical to the process for controlling the external application voltage described in the embodiment 1 (step S17), and thus the detailed description for the process is omitted.

As described above, instead of performing calculation on 1920×1080 first-order simultaneous equations twice, with the method using blocks, calculation of 16×9 first-order simultaneous equations and calculation of 32×18 first-order simultaneous equations are performed twice each.

Note that, when the Gauss-Jordan elimination is used as a solution to the first-order simultaneous equations, the operation amount increases in proportion to the square of the dimension. Accordingly, the operation amount can be reduced to 1/12 million by the blocks according to the embodiment 2.

As described above, by calculating the voltage drop amount using blocks divided in two different sizes, it is possible to provide a display device which can be driven at lower power consumption using a relatively low-cost operation circuit by significantly reducing the operation amount.

As described above, compared to the display device 100 according to the embodiment 1, in the display device according to the embodiment 2, the voltage drop amount calculating circuit 150 calculates the voltage drop amount for the anode-side power source line network 112 in the blocks roughly divided obtained by dividing the pixels 111 equally in the row direction and the column direction, each including 120×120 pixels, calculates the voltage drop amount for the anode-side power source line network 112 in the blocks finely divided obtained by diving the pixels 111 equally in the row direction and the column direction, each including 60×60 pixels, and estimates the distribution in the voltage drop amount in the anode-side power source line network 112 for each pixel 111, from the distribution of the voltage drop amount calculated for the blocks roughly divided and the distribution of the voltage drop amount calculated for the blocks finely divided. The same process applies to the cathode-side power source line network 113.

With this, the display device according to the embodiment 2 can significantly reduce the operation amount. Thus, it is possible to design space-saving operation circuit, reducing the manufacturing cost.

Note that, the process for calculating the voltage distribution in the anode-side power source line network 112 roughly divided into blocks (step S25) and the process for calculating the voltage distribution in the cathode-side power source line network 113 roughly divided into blocks (step S26) are examples of the calculating, and the process for calculating the voltage distribution in the anode-side power source line network 112 finely divided into blocks (step S28) and the process for calculating the voltage distribution in the cathode-side power source line network 113 (step S29) are examples of the calculating. Furthermore, the process for calculating the voltage drop amount in the anode-side power source line network 112 for each pixel 111 (step S30) and the process for calculating the voltage drop amount in the cathode-side power source line network 113 for each pixel 111 (step S31) are examples of the sub-estimating.

Although only some exemplary embodiments of the display device according to the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

Note that, in the display device according to the present disclosure, it is preferable that the voltage margin is regulated, corresponding to the change in temperature, for example. More specifically, a temperature sensor is provided in the organic EL display unit, and the voltage drop amount calculating circuit updates the video signal-pixel current conversion table (or conversion formula) according to the monitored value (measured temperatures) of the temperature sensor, for example. The following shall describe the display device in consideration of the change in temperature.

First, in the display device according to the embodiments 1 and 2, a problem possible to a case of temperature change shall be described. When the temperature of the organic EL display unit changes, the mobility and the threshold voltage of the driving transistor change, and the resistance of the organic EL element changes as well. For example, when the temperature increases, the mobility of the driving transistor increases and the current is more likely to flow in the driving transistor. In addition, the resistance in the organic EL element is reduced as well, and the current is more likely to flow in the organic EL element. With this, the voltage drop amount calculating circuit is affected by the temperature when converting the video signal into the pixel current, causing an error. For example, when the temperature of the organic EL display unit is 25° C., the video signal of level 128 is converted to a pixel current of 1 μA. When the temperature is 60° C., the actual flow of the pixel current for level 128 is the 1.2 μA.

If the flow transitions to the following voltage drop amount calculating flow without taking the change in the pixel current by the temperature into consideration, despite the fact that the current equal to or higher than the estimation (approximately 1.2 times higher) flows, the pixel current value for 25° C. is calculated in the pixel current calculating flow by the voltage drop amount calculating circuit. With this, the amount of voltage drop calculated by the voltage drop amount calculating circuit is smaller than the actual value (for example, although the actual voltage drop is 2.4 V, the voltage drop is calculated to be 2.0 V due to the increase in temperature in the calculation flow). Here, if the voltage margin that is initially set is 5 V, the amount of voltage drop is calculated as 2 V in the calculating flow of the amount of voltage drop. Thus, the display device makes an adjustment to reduce the power source voltage for 3 V (5 V−2 V). However, the actual voltage drop is 2.4 V, and thus reducing the power source voltage by 3 V sets the power source voltage lower by 0.4 V. Consequently, the power source voltage enters the linear region of the driving transistor, causing a display error. The display device according to the present disclosure has a configuration in consideration of the change in temperature in order to solve the problem, and is capable of performing an operation for compensating the change in temperature. The following shall describe the operation of the display device having the temperature sensor.

Figure 15:
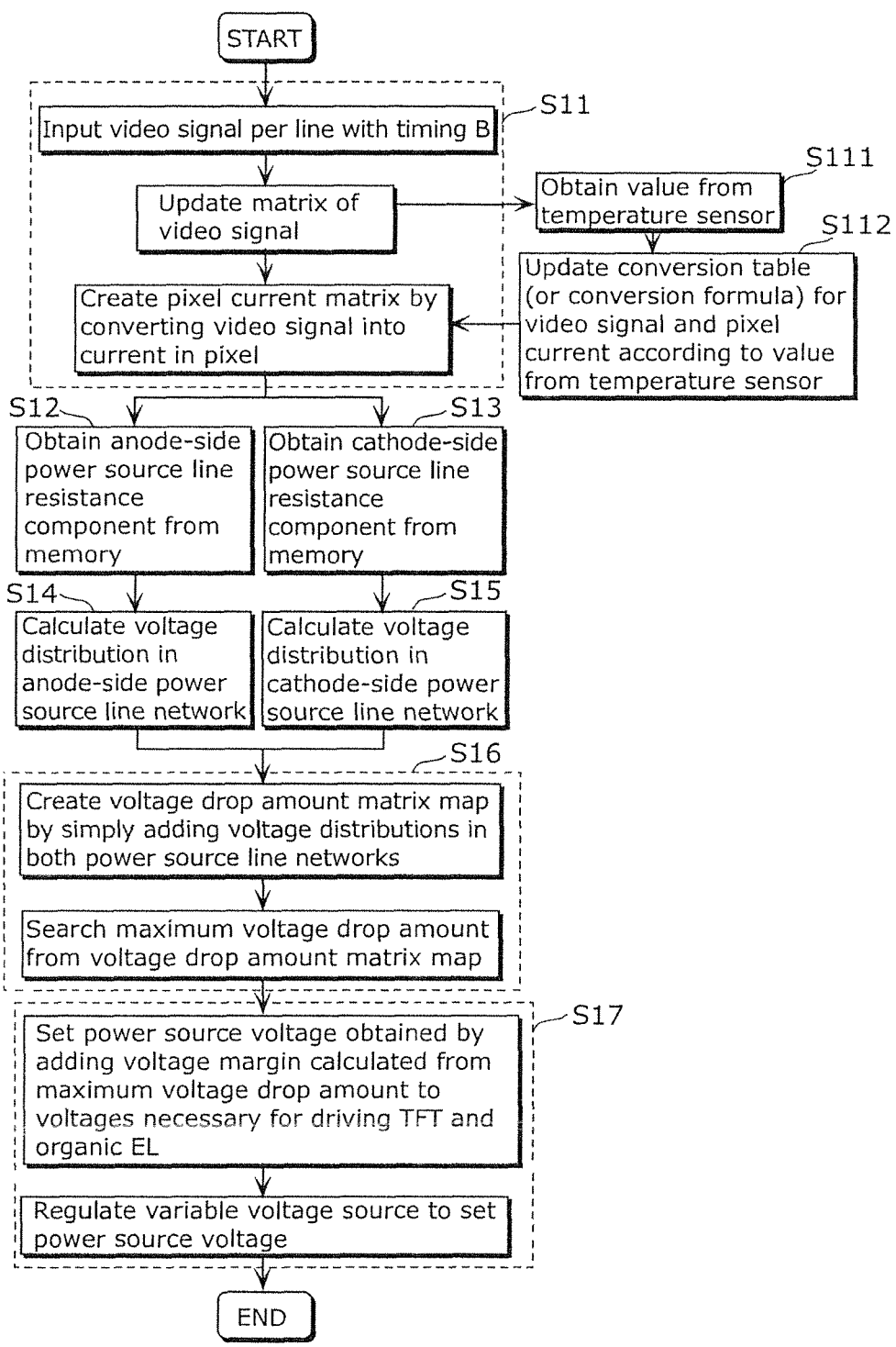
FIG. 15 is a flowchart indicating the operation of the display device according to the variation 1 of the embodiment 1 of the present disclosure.

FIG. 15 is a flowchart indicating the operation of the display device according to the variation 1 of the embodiment 1 of the present disclosure. In the flowchart according to the variation 1 of the embodiment 1 in FIG. 15, the operation in step S11 is different from the flowchart illustrating a specific example in FIG. 8. In the following description, the overlap with the flowchart in FIG. 8 shall be omitted, and only the difference shall be described.

First, the voltage drop amount calculating circuit 150 inputs the video signal for one pixel row updated between the state a and the state b.

Next, the voltage drop amount calculating circuit 150 updates the matrix of the video signal being held.

Next, the voltage drop amount calculating circuit 150 obtains the measured temperature data by the temperature sensor included in the display device 100 (step S111).

Next, the voltage drop amount calculating circuit 150 updates the video signal-pixel current conversion table (conversion formula) according to the obtained measured temperature data (step S112). More specifically, the voltage drop amount calculating circuit 150 changes the conversion table (or the conversion formula) into a conversion table (or a conversion formula) in consideration with the mobility of the driving transistor, the threshold voltage, and the resistance of the organic EL element at the measured temperature.

Next, the voltage drop amount calculating circuit 150 creates the pixel current matrix using the updated matrix of the video signal and the conversion formula to the pixel current or the conversion table to the pixel current.

With the operational flow described above, the display device according to the variation 1 of the embodiment 1 of the present disclosure allows setting a highly precise voltage margin unaffected by the change in temperature.

The display device according to the embodiment 1 according to the present disclosure performs creating the video signal matrix, the pixel current matrix, voltage distribution of the power source line network, and the voltage drop amount matrix, setting the voltage margin, and regulating the power source voltage in the variable-voltage source according to the operational flowchart illustrated in FIGS. 5 and 8. However, the operational flow from creating the pixel current matrix to creating the voltage drop amount matrix may be repeated for multiple times in order to increase the accuracy of the voltage margin setting.

Figure 16:
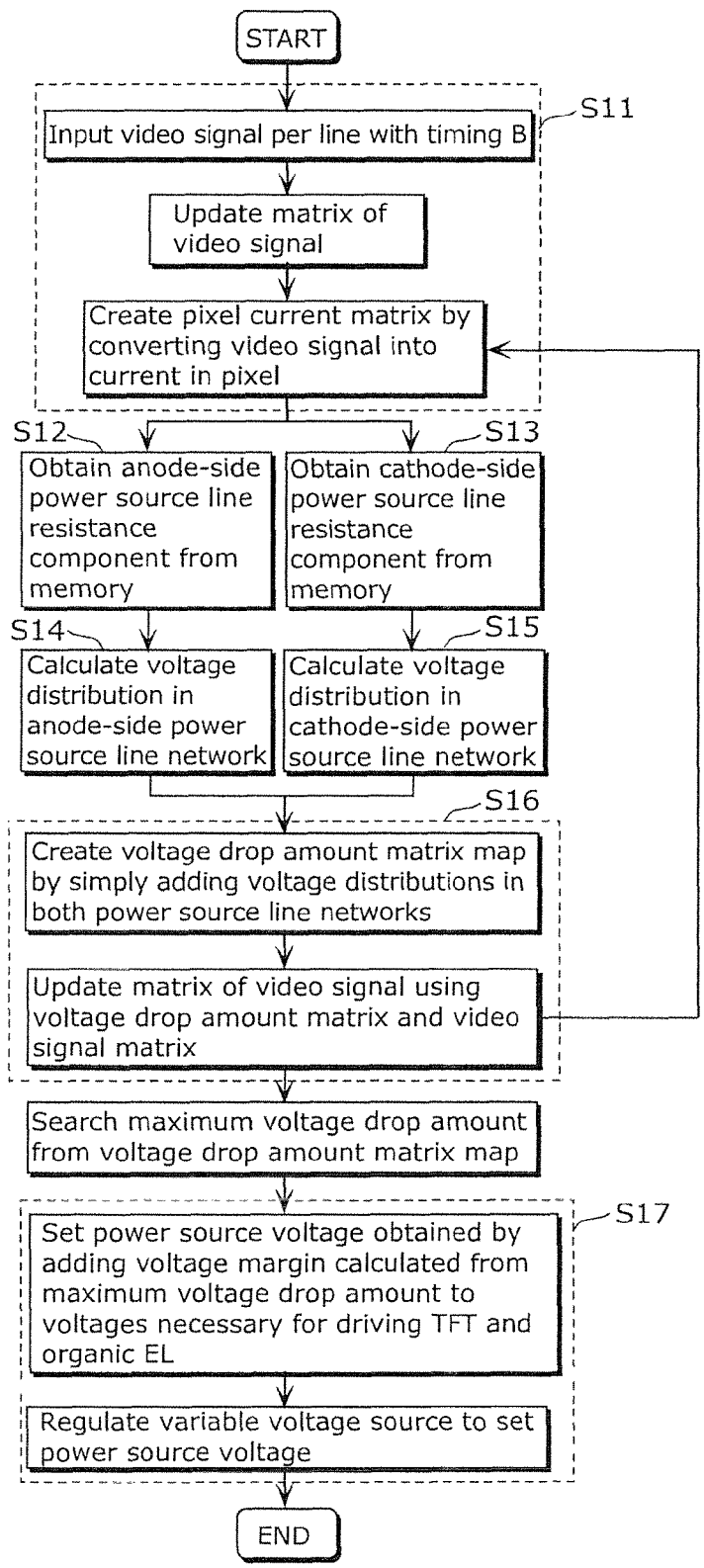
FIG. 16 is a flowchart indicating the operation of the display device according to the variation 2 of the embodiment 1 of the present disclosure.

FIG. 16 is a flowchart indicating the operation of the display device according to the variation 2 of the embodiment 1 of the present disclosure. Compared to the flowchart illustrating the specific example of the embodiment 1 in FIG. 8, the flowchart according to the variation 2 in the embodiment 1 in FIG. 16 is different in that the operational flow from creating the pixel current matrix to updating the video signal matrix are repeated for multiple times. In the following description, description for the process identical to the process illustrated in FIG. 8 is omitted, and only the difference shall be described.

The operation performed in each step is identical to the operation in FIG. 8. However, in step S16, after the voltage drop amount matrix is created, the video signal matrix is updated based on the voltage drop amount matrix, using the predetermined conversion formula (or the conversion table).

Subsequently, the process returns to step S11 with the updated video signal matrix, and the pixel current matrix is created again from the updated video signal matrix.

There is a case in which a voltage drop amount excessive to the actual pixel current flowing in the pixel is set as the largest voltage drop amount calculated by converting the input video signal into the pixel current. In response to this problem, the video signal matrix may be converted and updated by weighting the largest voltage drop amount that is set before, and resetting the voltage drop amount by the updated video signal matrix multiple times converge the voltage drop amount to be calculated to a constant value. This operation increases the accuracy of the calculating of the voltage drop amount. The following shall describe an example of the operational flow.

First, it is assumed that level 255 is input as the gradation level data of the predetermined pixel. Here, the data voltage corresponding to the level 255 is calculated by the conversion formula used in step S11, and the data voltage calculated is 4.5 V. In contrast, with the operational flow from step S11 to step S16, it is assumed that the maximum voltage drop amount is calculated as 4.1 V. In this case, the predetermined conversion formula is as follows:

Data voltage after conversion=data voltage−(maximum voltage drop amount×0.1)

In this case, the data voltage after conversion is calculated as 4.09 V (=4.5 V−4.1 V×0.1). The level corresponding to the converted data voltage is level 214. Thus, the level data in the predetermined pixel in the video signal matrix is updated as level 214, and the process from step S11 to step S16 is performed again. More highly accurate largest voltage drop amount can be calculated by repeating the operation multiple times.

Figure 17:
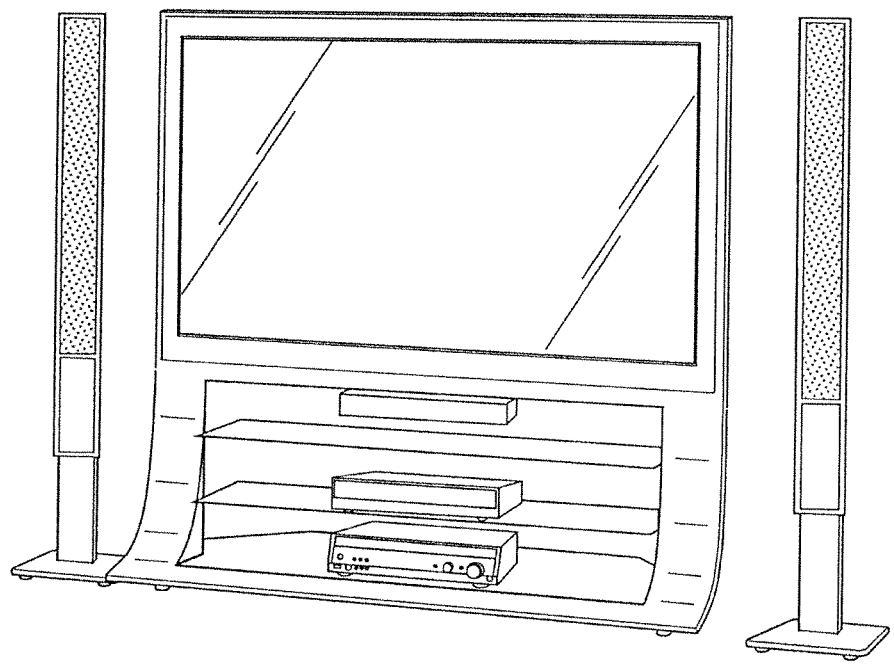
FIG. 17 is an external view of a thin flat TV in which the display device according to the present disclosure is incorporated.
Figure 18:
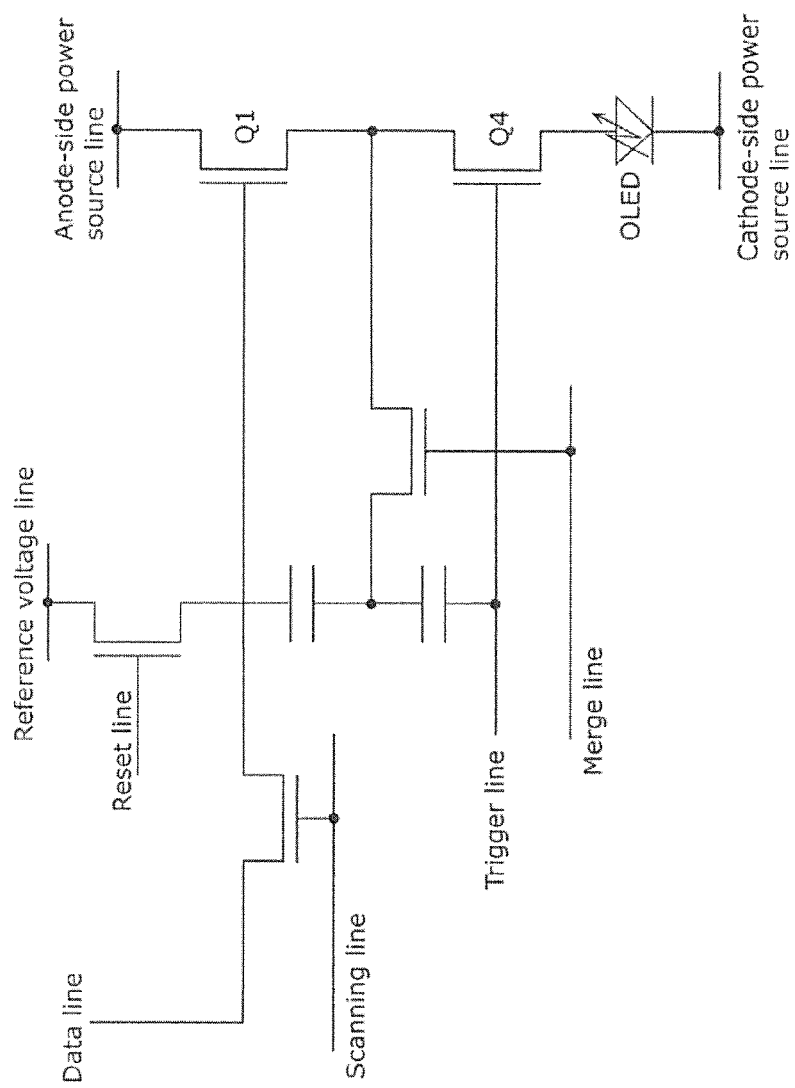
FIG. 18 is a circuit diagram illustrating a circuit configuration of a pixel for driving an organic EL element suggested by the patent literature 2.
Figure 19:
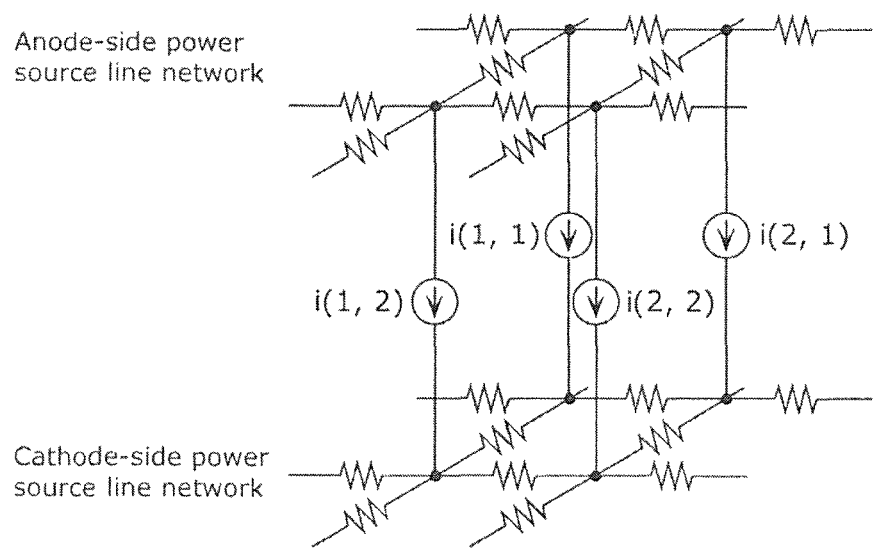
FIG. 19 schematically illustrates the configuration of an organic EL display by modeling each pixel as a current source.
Figure 20A:
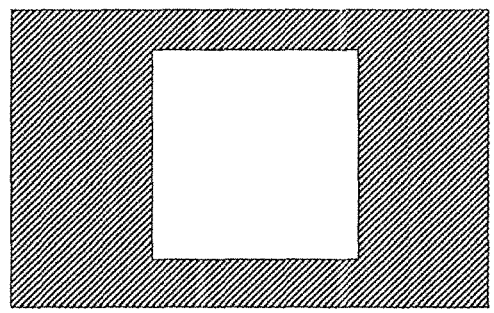
FIG. 20A is a diagram illustrating an example of a display image.
Figure 20B:
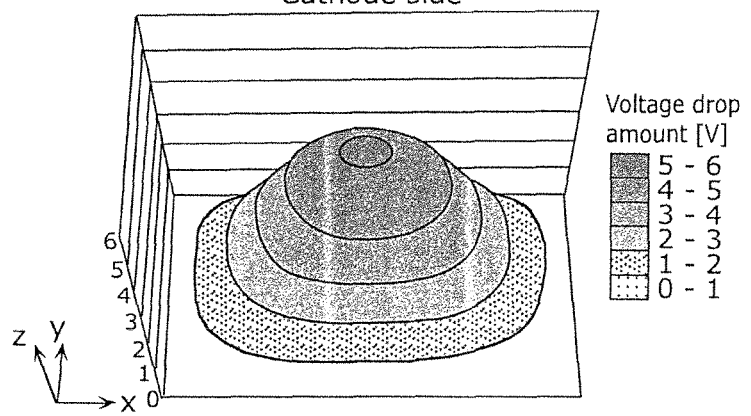
FIG. 20B is a graph illustrating a distribution of voltage drop amount in the cathode-side power source line when the image in FIG. 20A is displayed.
Figure 20C:
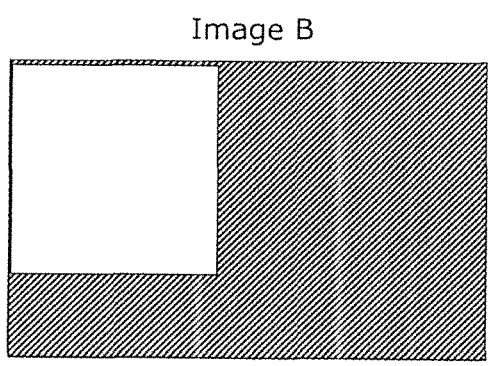
FIG. 20C is a diagram illustrating another example of display image.
Figure 20D:
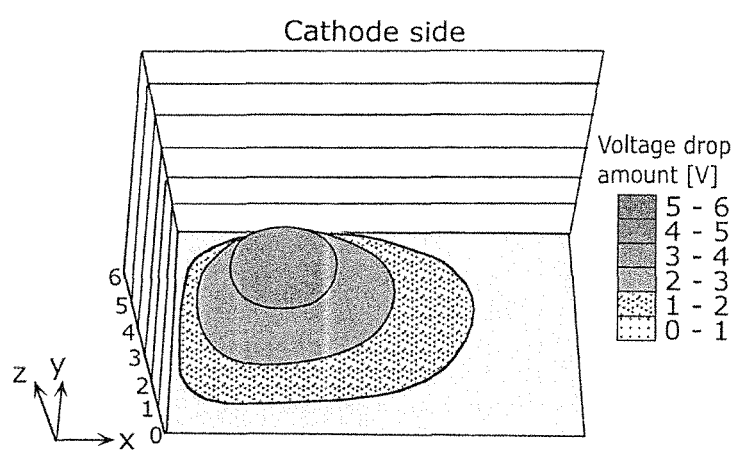
FIG. 20D is a graph illustrating a distribution of the voltage drop value in the cathode-side power source line when the image in FIG. 20C is displayed.

For example, the display device according to the present disclosure is incorporated in a thin-flat TV as illustrated in FIG. 17. By incorporating the display device according to the present disclosure, a thin-flat TV capable of displaying a high-definition image reflecting the video signal is implemented.

Furthermore, in the embodiments described above, the external application voltage is regulated by using the maximum total voltage drop amount vmax calculated by adding the voltage drop amount for each pixel 111 in the anode-side power source line network 112, the voltage drop amount for each pixel 111 in the cathode-side power source line network 113 for each pixel. In contrast, the maximum value of the voltage drop amount for each pixel 111 in the anode-side power source line network 112 and the maximum value of the voltage drop amount for each pixel 111 in the cathode-side power source line network 113 are calculated, and the external application voltage may be regulated using the sum of the maximum value of the calculated voltage drop amount for each pixel 111 in the anode-side power source line network 112 and the maximum value of the voltage drop amount in the cathode-side power source line network 113.

With this, even when there are multiple power source lines (the anode-side power source line network 112 and the cathode-side power source line network 113) it is possible to prevent the reduction in the luminance of the pixels 111 due to lack of voltage.

In the embodiment 2, the voltage drop in the anode-side power source line network 112 for each pixel 111 is estimated from the anode-side power source line network 112 roughly divided into blocks and the anode-side power source line network 112 finely divided into blocks, and a distribution of total voltage drop amount is calculated by adding the voltage drop in the cathode-side power source line network 113 for each pixel 111 estimated at the same time. Subsequently, from the calculation result, the in-screen maximum voltage drop for each pixel 111 is estimated. Alternatively, the distribution of the total voltage drop amount for blocks roughly divided may be calculated by adding the voltage drop amount in the anode-side power source line network 112 for roughly divided blocks and the cathode-side power source line network 113 for roughly divided blocks, and the distribution of the total voltage drop amount for finely divided blocks is calculated in the same manner. Subsequently, based on the distribution of the total voltage drop amount calculated for the blocks roughly divided and the distribution of the total voltage drop amount calculated for the blocks finely divided, the distribution of the total voltage drop amount may be estimated for each pixel 111, and the in-screen maximum voltage drop may be estimated from the estimation result.

In addition, in the embodiment 2, the pixels 111 included in one block are in the same number in the horizontal direction (column direction) and the vertical direction (row direction). However, the numbers of the pixels 111 in the horizontal direction and the vertical direction may be different.

Furthermore, in the embodiments described above, both the anode-side voltage and the cathode-side voltage output from the variable voltage source 170 are regulated. However, one of the voltages may be regulated.

In the embodiments described above, the external application voltage is regulated using the estimation of the distribution of the voltage drop amount in the anode-side power source line network 112 and the distribution of the voltage drop amount in the cathode-side power source line network 113. However, the external application voltage may be regulated by estimating one of the distribution of the voltage drop amount in the anode-side power source network 112 and the distribution of the voltage drop amount in the cathode-side power source line network 113, and based on one of the estimated distributions of the voltage drop amount.

Furthermore, although the switch transistor 124 and the driving transistor 125 are described as being p-type transistors in the above-described embodiments, they may be configured of n-type transistors.

Furthermore, although the switch transistor 124 and the driving transistor 125 are TFTs, they may be other field-effect transistors.

Furthermore, the processing units included in the display device described above are typically implemented as an LSI which is an integrated circuit. Note that part of the processing units included in the display device 100 can also be integrated in the same substrate as the organic EL display unit 110.

Furthermore, they may be implemented as a dedicated circuit or a general-purpose processor. Furthermore, a Field Programmable Gate Array (FPGA) which allows programming after LSI manufacturing or a reconfigurable processor which allows reconfiguration of the connections and settings of circuit cells inside the LSI may be used.

Furthermore, part of the functions of the data line driving circuit, the write scan driving circuit, the control circuit, the voltage drop amount calculating circuit, and the signal processing circuit included in the display devices according to the embodiments of the present disclosure may be implemented by having a processor such as a CPU executing a program. Furthermore, the present disclosure may also be implemented as a display device driving method including the characteristic steps implemented through the respective processing units included in the display device 100.

Furthermore, although the foregoing descriptions exemplify the case where the display devices are active matrix-type organic EL display device, the present disclosure may be applied to organic EL display devices other than the active matrix-type, and may be applied to a display device other than an organic EL display device using a current-driven light-emitting element, such as a liquid crystal display device.

INDUSTRIAL APPLICABILITY

As described above, the display device according to the present disclosure is capable of providing a display device that can be driven at low power consumption with the configuration described above. In particular, the configuration is useful for an active organic EL flat-panel display.

The invention claimed is:

1. A display device comprising:
a display unit having a plurality of pixels that are arranged two-dimensionally;
a voltage source which supplies a voltage to the display unit; and
a voltage regulating unit configured to regulate the voltage output by the voltage source, according to video data indicating luminance of each of the pixels, wherein:
the display unit further includes at least one power source line connected to the pixels and the voltage source, for supplying the voltage from the voltage source, and
the voltage regulating unit is configured to calculate, from the video data, a distribution of voltage drop amount in the at least one power source line for first blocks each including M pixels obtained by dividing the pixels equally in a column direction and a row direction, where M is an integer greater than or equal to 2, estimate the distribution of the voltage drop amount for each of the pixels based on the distribution of the voltage drop amount calculated for each of the first blocks, and regulate the voltage based on the estimated distribution of the voltage drop amount for each of the pixels.

2. The display device according to claim 1,
wherein the voltage regulating unit is further configured to calculate a distribution of the voltage drop amount for second blocks each including N pixels obtained by dividing the pixels equally in a column direction and a row direction, and to estimate the distribution of the voltage drop amount for each of the pixels, based on the distribution of the voltage drop amount calculated for each of the first blocks and the distribution of the voltage drop amount calculated for each of the second blocks, where N is an integer different from M and greater than or equal to 2.

3. The display device according to claim 1,
wherein the voltage regulating unit is configured to regulate the voltage, using a maximum value of the estimated distribution of the voltage drop amount for each of the pixels.

4. The display device according to claim 1, wherein:
the voltage source supplies, to the display unit, a first voltage and a second voltage different from the first voltage,
the at least one power source line includes a first power source line for supplying the first voltage and a second power source line for supplying the second voltage, and
the voltage regulating unit is configured to estimate a first distribution and a second distribution for each of the pixels, the first distribution being a distribution of the voltage drop amount in the first power source line, the second distribution being a distribution of the voltage drop amount in the second power source line, and to regulate the first voltage and the second voltage, based on a first distribution and a second distribution for each of the pixels estimated, respectively.

5. The display device according to claim 4,
wherein the voltage regulating unit is configured to regulate the first voltage and the second voltage, using a sum of a maximum value of the first distribution and a maximum value of the second distribution.

6. The display device according to claim 4,
wherein the voltage regulating unit is configured to calculate a total voltage drop amount which is a sum of the voltage drop amount in the first power source line and the voltage drop amount in the second power source line, by adding the first distribution and the second distribution for each of the pixels, and to regulate the first voltage and the second voltage, based on the distribution of the total voltage drop amount calculated.

7. The display device according to claim 6,
wherein the voltage regulating unit is configured to regulate the first voltage and the second voltage, using a maximum value of the distribution of the total voltage drop amount calculated.

8. The display device according to claim 4,
wherein each of the pixels includes a driver element and a light-emitting element,
the driver element includes a source electrode and a drain electrode,
the light-emitting element includes a first electrode and a second electrode, and the first electrode is connected to one of the source electrode and the drain electrode of the driver element, and
one of (i) the other of the source electrode and the drain electrode and (ii) the second electrode is connected to the first power source line, and the other of (i) the other of the source electrode and the drain electrode and (ii) the second electrode is connected to the second power source line.

9. The display device according to claim 8,
wherein the second electrode is a part of a common electrode provided in common to the pixels, and
the common electrode is electrically connected to the voltage source such that a potential is applied from a periphery of the common electrode.

10. The display device according to claim 9,
wherein the second electrode is formed of a transparent conductive material made of a metal oxide.

11. The display device according to claim 8,
wherein the light-emitting element is an organic electroluminescence (EL) element.

12. A method for driving a display device including a display unit having a plurality of pixels that are arranged two-dimensionally, voltage source which supplies a voltage to the display unit, and a voltage regulating unit which regulates the voltage output by the voltage source, according to video data indicating luminance of each of the pixels, the display unit further including at least one power source line connected to the pixels and the voltage source, for supplying the voltage from the voltage source, the method comprising steps of:

estimating, by the voltage regulating unit, a distribution of voltage drop amount in the at least one power source line for each of the pixels from the video data which is data indicating luminance of each of the pixels; and regulating, by the voltage regulating unit, the voltage based on the distribution of voltage drop amount estimated for each of the pixels, wherein the step of estimating includes:

calculating, by the voltage regulating unit, a distribution of the voltage drop amount for first blocks each including M pixels, obtained by dividing the pixels equally in a row direction and a column direction, where M is an integer greater than or equal to 2;

calculating, by the voltage regulating unit, a distribution of the voltage drop amount for second blocks each including N pixels, obtained by dividing the pixels equally in a row direction and a column direction, where N is an integer different from M and greater than or equal to 2; and sub-estimating, by the voltage regulating unit, the distribution of the voltage drop amount for each of the pixels, based on the distribution of the voltage drop amount calculated for each of the first blocks and the distribution of the voltage drop amount calculated for each of the second blocks.

13. A display device comprising:

a display unit having a plurality of pixels that are arranged two-dimensionally;

a voltage source which supplies a voltage to the display unit; and a voltage regulating unit configured to regulate the voltage output by the voltage source, according to video data indicating luminance of each of the pixels, wherein:

the display unit further includes at least one power source line connected to the pixels and the voltage source, for supplying the voltage from the voltage source, and the voltage regulating unit is configured to calculate, from the video data, a distribution of voltage drop amount in the at least one power source line for first blocks each including M pixels obtained by dividing the pixels in a column direction and a row direction, where M is an integer greater than or equal to 2, estimate the distribution of the voltage drop amount for each of the pixels based on the distribution of the voltage drop amount calculated for each of the first blocks, and regulate the voltage based on the estimated distribution of the voltage drop amount for each of the pixels.

* * * * *